United States Patent
Scott et al.

(10) Patent No.: US 8,674,406 B2
(45) Date of Patent: Mar. 18, 2014

(54) EXTENDED WAVELENGTH DIGITAL ALLOY NBN DETECTOR

(75) Inventors: Jeffrey W. Scott, Carpinteria, CA (US); George Paloczi, Goleta, CA (US)

(73) Assignee: Lockheed Martin Corp., Bethesda, MD (US)

( * ) Notice: Subject to any disclaimer, the term of this patent is extended or adjusted under 35 U.S.C. 154(b) by 609 days.

(21) Appl. No.: 12/837,444

(22) Filed: Jul. 15, 2010

(65) Prior Publication Data

US 2011/0037097 A1 Feb. 17, 2011

Related U.S. Application Data

(60) Provisional application No. 61/213,816, filed on Jul. 17, 2009.

(51) Int. Cl.
*H01L 31/00* (2006.01)
(52) U.S. Cl.
USPC ............ 257/184; 257/189; 257/E31.001; 257/E31.019; 250/338.4
(58) Field of Classification Search
USPC ............ 257/18, 21, 22, 184, 189, E31.001, 257/E31.019; 258/338.4; 438/14; 250/338.4
See application file for complete search history.

(56) References Cited

U.S. PATENT DOCUMENTS

| | | | |
|---|---|---|---|
| 4,679,063 A | 7/1987 | White | |
| 5,479,032 A | 12/1995 | Forrest et al. | |
| 5,767,535 A | 6/1998 | Bachem et al. | |
| 6,222,200 B1 | 4/2001 | Svilans | |
| 7,687,871 B2 | 3/2010 | Maimon | |
| 2002/0125472 A1 | 9/2002 | Johnson et al. | |
| 2007/0054467 A1* | 3/2007 | Currie et al. | 438/458 |
| 2007/0215900 A1* | 9/2007 | Maimon | 257/184 |
| 2008/0111152 A1 | 5/2008 | Scott et al. | |
| 2008/0257405 A1 | 10/2008 | Sharps | |
| 2008/0310847 A1* | 12/2008 | Shpantzer et al. | 398/115 |
| 2010/0155777 A1* | 6/2010 | Hill et al. | 257/184 |

FOREIGN PATENT DOCUMENTS

| | | |
|---|---|---|
| EP | 1162667 A1 | 12/2001 |
| JP | 62-35682 A | 2/1987 |

* cited by examiner

*Primary Examiner* — Tuan N. Quach
(74) *Attorney, Agent, or Firm* — Birch, Stewart, Kolasch & Birch, LLP

(57) ABSTRACT

A strain-balanced photodetector is provided for detecting infrared light at an extended cutoff wavelength in the range of 4.5 μm or more. An InAsSb absorber layer has an Sb content is grown in a lattice-mismatched condition to a GaSb substrate, and a plurality of GaAs strain-compensating layers are interspersed within the absorber layer to balance the strain of the absorber layer due to the lattice mismatch. The strain-compensation layers allow the absorber to achieve a thickness exhibiting sufficient absorption efficiency while extending the cutoff wavelength beyond that possible in a lattice-matched state. Additionally, the strain-compensation layers are sufficiently thin to be substantially quantum-mechanically transparent such that they do not substantially affect the transmission efficiency of the absorber. The photodetector is preferably formed as a majority carrier filter photodetector exhibiting minimal dark current, and may be provided individually or in a focal plane array.

72 Claims, 22 Drawing Sheets

EXTENDED WAVELENGTH DIGITAL ALLOY NBN DETECTOR

FIELD OF THE INVENTION

The present invention relates in general to photodetectors, and in particular to infrared photodetectors with a majority carrier filter structure.

BACKGROUND OF THE INVENTION

A photodetector sensitive to the infrared wavelengths of light is also known as an infrared detector. Infrared detectors are used in a wide variety of applications, and in particular are used as thermal detection for surveillance, tracking, night vision, search and rescue, non destructive testing and gas analysis. Typically, an infrared detector is formed as a device consisting of an array, usually rectangular, of infrared light-sensing photodetectors disposed at the focal plane of an imaging lens. Such a detector is commonly referred to as a focal plane array (FPA).

Infrared covers a broad range of wavelengths, and many materials are only sensitive to a certain range of wavelengths. As a result, the infrared band is further divided into sub-bands such as near infrared defined conventionally as 0.75 to 1.0 µm; short-wavelength infrared (SWIR) defined conventionally as 1.0 to 3.0 µm; mid-wavelength infrared (MWIR) defined conventionally as 3 to 5 µm; and long-wavelength infrared (LWIR) defined conventionally as 8 to 14 µm. Infrared in the range of 5 to 8 µm is not transmitted well in the atmosphere and thus many mid-wavelength infrared detection applications operate within the 3 to 5 µm atmospheric window portion of the MWIR band.

Infra-red photon detectors are often produced using InSb and HgCdTe p-n junction diodes. However, these thermal detectors require cooling to cryogenic temperatures of around 77 K, which is complex, energy and volume consuming, and costly. The cryogenic temperatures are primarily used to reduce the dark current generated in the p-n junction diode in the bulk and at the surface by Shockley Reed Hall (SRH) generation, among other effects.

Photodetectors comprising a photo-absorbing layer, a barrier layer, and a contact layer have overcome many disadvantages of prior photodetectors, including mid-wavelength infrared detectors. A new class of photodetectors employing majority carrier filter principles is described in U.S. Pat. No. 7,687,871 to Maimon, filed Mar. 19, 2006, the entire contents of which are hereby incorporated by reference. These majority carrier filter photodetectors are often referred to as nBn detectors although the majority carrier filter principles may be employed using a variety of doping arrangements.

Photodetectors have been produced that are sensitive to a target waveband and that comprise a photo-absorbing layer preferably exhibiting a thickness of between one and two times the optical absorption length. These photodetectors may be comprised of an n-doped photo-absorbing layer, a barrier layer, and an n-doped contact layer. Other dopings may be used, such as p-doped photo-absorbing and contact layers as described by Maimon. These detectors may use an absorber to convert the incoming radiation into minority carriers which are collected to generate photocurrent. These detectors may use a barrier layer whose minority carrier band edge lines up with the absorber minority carrier band edge so that carriers can be collected. The majority carrier band edge of the barrier is well above the contact or absorber band edge such that majority carriers are blocked or filtered, thus producing the function described by the term "majority carrier filter." The barrier layer exhibits a thickness sufficient to prevent tunneling of majority carriers from the photo-absorbing layer to the contact layer, and a barrier in the majority carrier energy band sufficient to block the flow of thermalized majority carriers from the photo-absorbing layer to the contact layer. The barrier layer does not significantly block minority carriers when appropriate bias voltage is applied.

In particular, for an n-doped photo-absorbing layer the heterojunction between the barrier layer and the absorbing layer is such that there is substantially zero valence band offset, i.e. the band gap difference appears almost exclusively in the conduction band offset. For a p-doped photo-absorbing layer the heterojunction between the barrier layer and the absorbing layer is such that there is substantially zero conduction band offset, i.e. the band gap difference appears almost exclusively in the valence band offset. Advantageously, these photodetectors can be operated with minimal to no depletion layer, and thus the dark current is significantly reduced. Furthermore, passivation is not required in arrayed photodetector elements as the barrier layer further functions to achieve passivation.

The specific materials used to produce a majority carrier filter are not critical so long as the valance and conduction bands are configured as described above. However, the materials should be selected to produce the valence and conduction band relationships discussed above. The barrier layer may comprise any suitable material such as one of AlSb, AlAsSb, GaAlAsSb, AlPSb, AlGaPSb and HgZnTe. Similarly, the photo-absorbing layer may be desirably constituted of one of n-doped InAs, n-doped InAsSb, n-doped InGaAs, n-doped InGaAsSb, n-doped Type II super lattice InAs/InGaSb and n-doped HgCdTe. The contact area may be constituted of one of InAs, InGaAs, InAsSb, InGaAsSb, Type II super lattice InAs/InGaSb, HgCdTe and GaSb. Alternatively, the photo-absorbing layer and/or contact layer may be p-doped. The contact layer and the photo-absorbing layer may exhibit substantially identical compositions. In the case where the photo-absorbing layer and contact layer have the same doping type but two different bandgaps, two-color operation can be achieved by reversing the bias voltage so that the photons absorbed in the "contact" layer are now collected in the "absorbing" layer. The bias can be alternatingly reversed so as to collect photons within two different radiation bands, corresponding to photons collected when the photodetector is forward-biased and when the photodetector is reverse-biased, respectively. For backside-illuminated focal plane arrays the top or "contact" layer should have the smaller bandgap in order to absorb the longer radiation band.

For a photo-absorbing material made from semiconductor materials, the absorption cutoff wavelength of the photo-absorbing material is generally determined by the composition of the semiconductor, but may be limited by dislocations in the molecular structure of the semiconductor lattice. The absorber material may be grown by liquid phase epitaxy (LPE), molecular beam epitaxy (MBE), metal-organic chemical vapor deposition (MOCVD), or other methods known to those skilled in the art on substrate materials such as InSb, GaSb, InAs, InP, etc. However, to avoid substantial dislocations in the absorber material, the absorber should be a composition that has a crystal lattice constant similar to that of the substrate material. If the lattice constant of the absorber alloy does not match the lattice constant of the substrate material, the strain on the composition of the absorber due to the mismatch between the absorber and substrate lattice structures will increase as the absorber is grown, and will ultimately result in dislocations in the layers of the absorber lattice once the absorber exceeds a critical thickness.

For practical purposes, to grow an absorber with sufficient thickness such that the absorber has reasonable quantum efficiency, the lattice constant of the absorber must very closely match the lattice constant of the substrate upon which the absorber material is grown. This requirement that the absorber materials be lattice-matched to the substrate material effectively limits the absorption cutoff wavelengths of the photodetector to specific values. For example, an absorber comprising InAs(0.9)Sb(0.1), when lattice-matched to a substrate comprising GaSb and having a lattice constant of 6.09 A, exhibits an associated cutoff wavelength of 4.2 µm. However, this cutoff wavelength falls well short of the upper end of the 3 to 5 µm range for MWIR detection applications operating within the atmospheric window of the infrared band. Since there is much more infrared flux in the longer wavelength it is desirable to absorb the full MWIR band when the highest sensitivity for the photodetector is desired.

FIG. 2 shows the behavior of unstrained band-edge discontinuities as a function of the lattice constant. The unstrained band alignments of any two lattice-matched alloys can be determined by noting the relative position of their band edges in FIG. 2. For strained conditions, the mechanical strain fields alter the behavior of the electronic wavefunctions, thereby changing the valence and conduction bands, but the general behavior is similar. Highly ordered atomic transitions occur between lattice-matched semiconductor heterostructures with relatively little atomic and electronic reconstruction. However, in a lattice-mismatched condition defects occur in the crystal structure of the absorber when the absorber lattice dislocates to relieve the excess strain resulting from the lattice mismatch between the absorber and the substrate. These crystalline defects directly effect the operating characteristics of the photodetector device, degrading the quality, e.g. the radiative efficiency and thermal noise, of the semiconductor.

There are limited substrates available for crystal growth, usually the binary materials like InAs or GaSb shown in FIG. 2 although other alloys may be used. Conventionally, the only cutoff wavelengths available come from alloys whose lattice constant match the substrate. It is desirable for design versatility in various infrared sensing applications to be able to achieve cutoff wavelengths other than and beyond those of lattice-matched systems. Sometimes it is possible to grow quaternaries to raise or lower the band gap, for example, by adding aluminum or nitrogen to the absorber material. However, this approach can result in poor absorber material quality or a complicated growth processes.

Additionally, despite the potential for lattice defects, photodetectors with highly strained absorbers have been grown to achieve an extended cutoff frequency. For example, the maximum wavelength normally achievable with a highly strained absorber on a substrate comprising GaSb is 4.5 µm or less. However, the high strain resulting from this approach limits the absorber thickness and material quality. Superlattices using InAs/GaSb have been used to create an effective tunable bandgap in the GaSb system. However, the complicated growth and the band edges of the superlattice system relative to the barrier have made it difficult to achieve MWIR barrier detectors with superlattice absorbers.

It is desirable for photodetectors, and in particular majority carrier filter type photodetectors with reduced dark current, to operate in wavelengths not accessible using materials in the lattice-matched condition. Aspects of the present invention relate generally to solving the problems associated with photodetectors, in particular majority carrier filter type photodetectors, where absorption cutoff wavelengths are limited by absorber/substrate lattice-matching requirements, such that photodetectors exhibiting cutoff wavelengths beyond conventional cutoff wavelengths can be realized. It is desirable to operate in wavelengths not accessible in the lattice-matched condition and to extend the wavelength out to 5.0 µm or further to take full advantage of the 3 to 5 µm atmospheric transmission portion of the MWIR band. The present invention has been developed in view of these considerations, and therefore it is an object of the invention to provide a photodetector with an extended cutoff while also maintaining the band lineups at the junctions of the layers of majority carrier filter detector.

SUMMARY OF THE INVENTION

The present invention relates to a photodetector, in particular a majority carrier filter photodetector, comprising a photo-absorbing region comprising a plurality of strained photo-absorbing layers of a first alloy and a plurality of strain-compensating layers of a second alloy interspersed between the photo-absorbing layers. The optical absorption is in the photo-absorbing layers, whose spectral absorption properties are determined by the photo-absorbing layer composition.

According to aspects of the present invention, the material forming the plurality of strain-compensation layers exhibit a substantially different lattice constant than that of both the substrate and the remaining absorber material. These thin layers have an aggregate strain substantially equal to the aggregate strain of the photo-absorbing layers but of opposite sign, thereby compensating for the strain of the absorber material. This allows for the growth of sufficiently thick aggregate photo-absorbing layers which do not contain dislocations in the lattice structure of the semiconductor alloy comprising the photo-absorbing layers. The resultant strain-compensated structure of the photodetector allows for the use of an absorber alloy exhibiting a different lattice constant than the lattice constant of the substrate while exceeding the critical thickness at which the lattice structure normally dislocates. The relationship between the critical thickness with respect to increasing strain and eventual dislocations between lattice-mismatched materials is described, for example, in J. W. Matthews and A. E. Blakeslee, J. Cryst. Growth 27, 118 (1974), the entire contents of which are incorporated herein by reference.

More specifically, according to aspects of the present invention, the strain-compensation layers may be grown alternately with the photo-absorber alloy using epitaxial techniques. The strain-compensation layers are grown sufficiently thin such that they are substantially transparent in quantum-mechanical effect and do not significantly affect the spectral properties of the overall photo-absorbing region. This allows for growth of a photo-absorbing region sufficiently thick to have reasonable quantum efficiency and without exhibiting the dislocation defects that normally would be caused by excessive strain within the absorber alloy. This allows the photodetector to operate beyond the cutoff wavelength of a photodetector with an absorber layer comprising a traditional alloy lattice-matched to the substrate. Similarly one can achieve shorter cutoff wavelengths than the lattice matched alloy, if desirable.

According to aspects of the present invention, the strain-compensation layers are sufficiently thin to be effectively quantum-mechanically transparent. The plurality of strain-compensating layers can be interspersed between the plurality of photo-absorbing layers at a periodic interval such that the strain-compensation layers are substantially transparent to quantum waveforms. Therefore the cutoff wavelength can be extended while also maintaining the band lineups at the junctions of the layers of a majority carrier filter photodetector, as well as maintaining the reduced dark current characteristics of majority carrier filter photodetector. These and other advantages of the present invention will become evident to those skilled in the art.

In an exemplary embodiment of the present invention, the photo-absorbing layers are comprised of InAsSb alloy, the strain-compensation layers are comprised of GaAs alloy, and the substrate is comprised of GaSb alloy. By interspersing the GaAs strain-compensation layers between the photo-absorbing layers, the antimony content in the $InAs_xSb_{1-x}$ alloy can be increased such that the photodetector may exhibit a cutoff wavelength exceeding the lattice-matched 4.2 µm and preferably extending to 5.0 µm or more.

According to alternative embodiments of the present invention, the photo-absorbing layers may be comprised of InGaAsSb alloys. Additionally, the strain-compensation layers may be alternatively comprised of InSb alloy. The substrate may be comprised of InAs binary. In addition to the alloys described herein, one of ordinary skill in the art will readily appreciate that many other alloys of thin strain compensating layers may be used without deviating from the scope of the inventive concept described herein.

According to certain embodiments of the present invention, the lattice constant of the photo-absorbing layers is larger than the substrate such that each photo-absorbing layer is compression-strained and each strain-compensating layer is tensile-strained. In alternative embodiments, the lattice constant of the photo-absorbing layers is smaller than the substrate such that each photo-absorbing layer is tensile-strained and each strain-compensating layer is compression-strained.

According to a further embodiment of the present invention, the contact layer may comprise a plurality of photo-absorbing layers and a plurality of strain-compensating layers interspersed between the plurality of photo-absorbing layers, wherein the photo-absorbing layers are substantially lattice-mismatched to the barrier layer, and the strain-compensating layers are interspersed between the photo-absorbing layers so as to substantially compensate for a mechanical strain of the photo-absorbing layers caused by the lattice-mismatched condition.

In a further embodiment of the present invention, a strain-balanced two-color photodetector is provided, which can detect infrared light within two radiation bands each having a different cutoff wavelength. According to the features of this embodiment, at least one of a first layer (photo-absorbing layer) and a second layer (contact layer) located above the barrier layer is grown substantially lattice-mismatched to the substrate and/or the barrier layer. Either or both of the first and second layers may comprise a plurality of strain-compensating layers interspersed between a plurality of photo-absorbing layers so as to substantially compensate for a mechanical strain of the photo-absorbing layers caused by the lattice-mismatched condition. The first layer can exhibit a first cutoff wavelength and the second layer can exhibit a second cutoff wavelength, wherein the first cutoff wavelength can be shorter than the second cutoff wavelength.

According to certain embodiments of the two-color photodetector of the present invention, the first layer can comprise an alloy of InAsSb substantially lattice-matched to GaSb, and the second layer can comprise a plurality of tensile-strained strain-compensating layers interspersed between a plurality of compressive-strained photo-absorbing layers comprised of InGaAsSb. Additionally, the strain-compensating layers in the second layer can be comprised of GaAs.

In an alternative embodiment of the two-color photodetector of the present invention, the first layer can comprise a plurality of compressive-strained strain-compensating layers comprised of $InAs_wSb_{1-w}$ interspersed between a plurality of tensile-strained photo-absorbing layers comprised of $In_xGa_{1-x}As_ySb_{1-y}$, and the second layer can comprise an alloy of InAsSb substantially lattice-matched to GaSb. Additionaly, the strain-compensating layers in the first layer can be comprised of InSb.

In an alternative embodiment of the two-color photodetector of the present invention, the first layer can comprise a plurality of compressive-strained strain-compensating layers comprised of $InAs_wSb_{1-w}$ interspersed between a plurality of tensile strained photo-absorbing layers comprised of $In_xGa_{1-x}As_ySb_{1-y}$. The strain-compensating layers of the first layer can be comprised of InSb, and the strain-compensating layers of the second layer can be comprised of GaAs.

In an alternative embodiment of the two-color photodetector of the present invention, the first layer can comprise a plurality of photo-absorbing layers comprised of InAsSb and a plurality of strain-compensating layers comprised of GaAs, and the second layer comprises a plurality of photo-absorbing layers comprised of InGaSb and a plurality of strain-compensating layers comprised of InSb.

According to further aspects of the two-color photodetector the present invention, the substrate can comprise GaSb or InAs, and the barrier layer can comprise AlAsSb or AlGaAsSb.

In a further embodiment of the present invention, a photodetector is provided where the minority carrier bandedge of at least one of the first and second layers can be graded vertically by varying the alloy composition in a direction toward the barrier layer. A plurality of varying strain-compensating layers can be interspersed within a graded layer such that the lattice structure is substantially prevented from dislocating. In certain embodiments of the present invention, the interval between the strain-compensating layers in the graded layer can be gradually varied in the direction toward the barrier layer in order to balance the varying strain within the graded layer. In other embodiments of the present invention, the thickness of the strain-compensating layers in a graded layer can be gradually varied in the direction toward the barrier layer in order to balance the varying strain within the graded layer. Alternatively, both of the thickness and periodicity of the strain-compensation layers may be varied in order to balance the varying strain within a graded layer.

According to a further embodiment of the present invention, a focal plane array with an extended cutoff wavelength may be provided by forming a two-dimensional matrix of a plurality of photodetectors with strain-balanced structures formed according to any of the aforementioned embodiments.

In an additional embodiment, a method of forming a strain-balanced extended-wavelength photodetector for a desired cutoff wavelength is provided. According to the method, a desired cutoff wavelength for the photodetector is selected. Then, a mole fraction is determined for the absorber alloy corresponding to the desired cutoff wavelength to be exhibited by the absorber layer. A layer thickness ratio between a thickness of the strain-compensation layers and the photo-absorbing layers within the absorber is determined, wherein the ratio is sufficient to achieve strain balancing of the photo-absorbing layers for the determined mole fraction. Next, a periodic interval is selected for providing the strain-compensation layers within the absorber at the thickness corresponding to the determined layer thickness ratio such that the strain-compensation layers are substantially electrically transparent to minority carriers. The photodetector absorber layer is then grown by alternatingly growing on the substrate a plurality of photo-absorbing layers of a first alloy and the plurality of strain-compensation layers of a second alloy at the determined periodic interval such that the strain-compensating layers are substantially quantum-mechanically transparent while compensating for a mechanical strain of the photo-absorbing region on a substrate in a lattice-mismatched condition.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become readily apparent from this detailed description to those skilled in the art.

BRIEF DESCRIPTION OF THE DRAWINGS

The present invention will become more fully understood from the detailed description given herein below and the accompanying drawings, which are given by way of illustration only and thus are not limitative of the present invention, and wherein.

The drawings will be described in detail in the course of the detailed description of the invention.

DETAILED DESCRIPTION OF THE INVENTION

The following detailed description of the invention refers to the accompanying drawings. The same reference numbers in different drawings identify the same or similar elements. Also, the following detailed description does not limit the invention. Instead, the scope of the invention is defined by the appended claims and equivalents thereof.

Figure 1A:
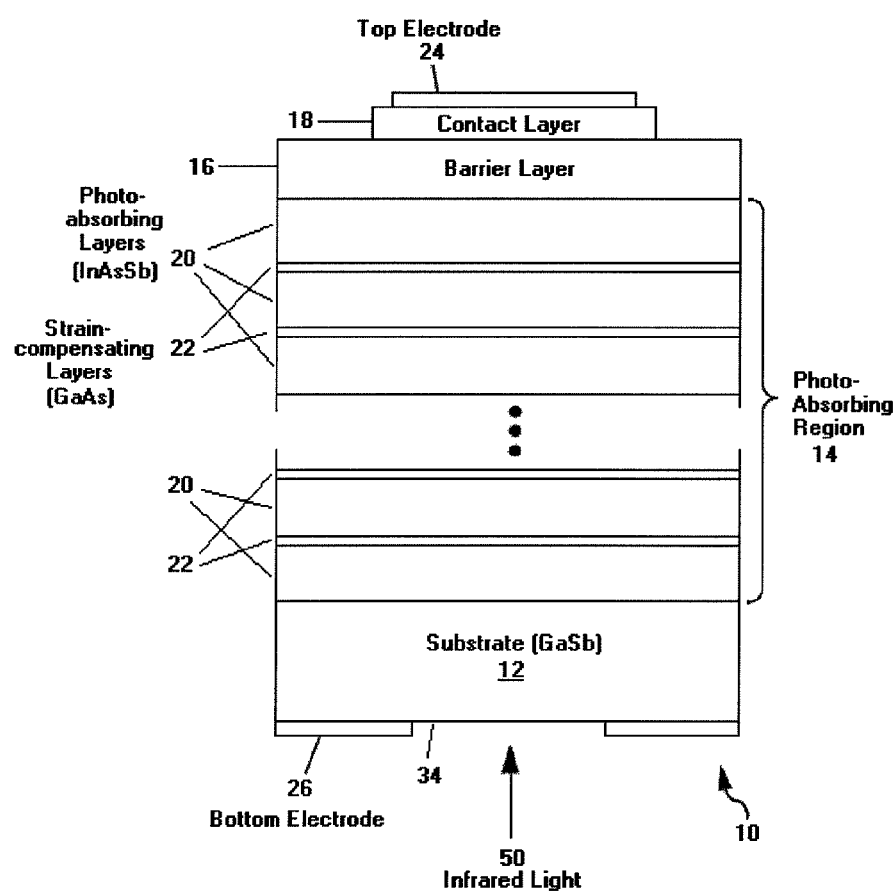
FIG. 1A shows a schematic cross-section view of an exemplary embodiment of a photodetector according to the present invention.

FIG. 1A shows a schematic cross-section view of an exemplary embodiment of a photodetector 10 of the present invention. Photodetector 10 comprises a semiconductor substrate 12 on which a plurality of III-V compound semiconductor layers are epitaxially grown to form a photo-absorbing region 14, a barrier layer 16, and a contact layer 18. The photo-absorbing region 14 (i.e. absorber, photo-absorber, absorber layer) comprises a plurality of strain-compensating layers 22 which are alternatingly interspersed between a plurality of photo-absorbing layers 20. In addition, a top electrode 24 is located above the contact layer 18 and a bottom electrode 26 is located below the substrate 12. In an alternate preferred embodiment shown in FIG. 1B, a via 34 is etched in the barrier layer 16 down to the top surface of the photo-absorbing region 14, and the bottom electrode 26 is located on the absorber layer top surface 30 through the via 34.

Figure 1B:
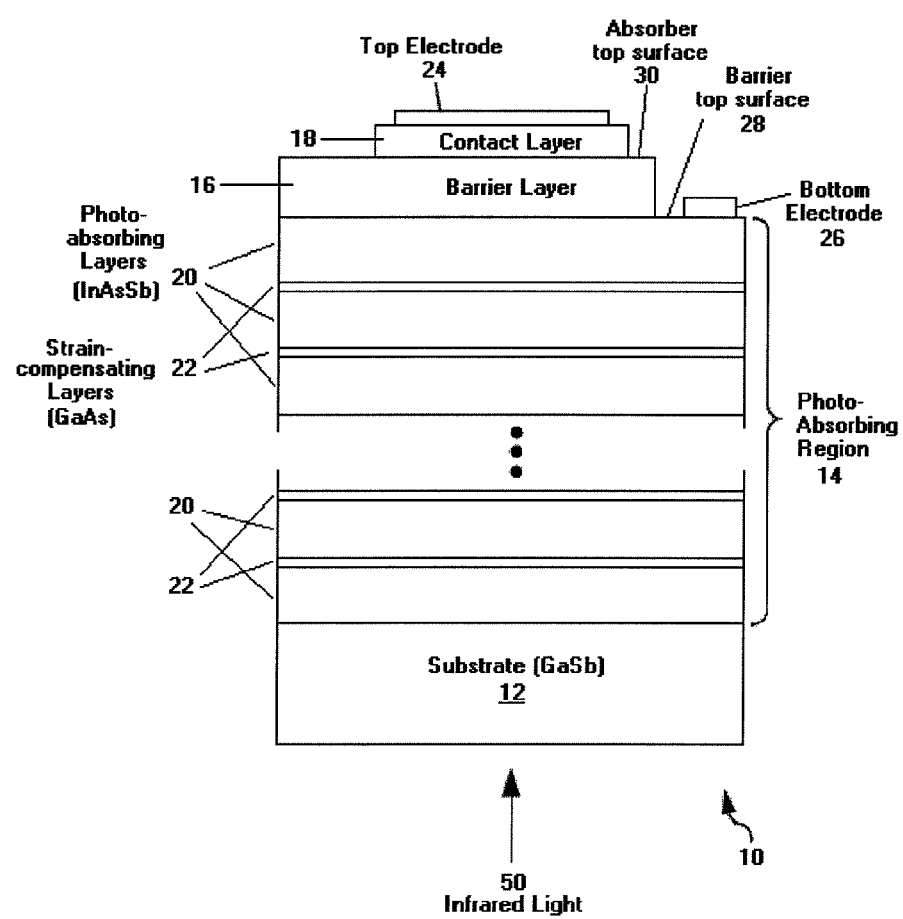
FIG. 1B shows a schematic cross-section view of an exemplary embodiment of a photodetector according to the present invention, wherein both electrodes are disposed on the top side of the photodetector.

In the exemplary embodiments of FIGS. 1A and 1B, the photo-absorbing layers 20 comprise indium arsenide antimonide (InAsSb) and the strain-compensating layers 22 comprise gallium arsenide (GaAs). The substrate 12 comprises gallium antimonide (GaSb). In other embodiments of the present invention, the photo-absorbing layers 20 can comprise indium gallium arsenide (InGaAs). In other embodiments of the present invention, the strain-compensating layers 22 can comprise indium antimonide (InSb). In further embodiments of the present invention, the substrate can comprise indium arsenide (InAs). In addition to these alloys, one of ordinary skill in the art will readily appreciate that other alloys may be used without deviating from the scope of the inventive concept described herein.

In the embodiments of FIGS. 1A and 1B, the composition of the InAsSb photo-absorbing layers 20 includes a sufficient mole fraction of antimony (Sb) content such that the photodetector absorbs incident infrared light 50 at a predetermined cutoff wavelength longer than the conventional lattice-matched wavelength of 4.2 μm. Preferably, the composition of the InAsSb photo-absorbing layers 20 is sufficient to absorb infrared light 50 at wavelengths of 5.0 μm or more in order to take full advantage of the atmospheric region of the MWIR band. As used herein, the term "cutoff wavelength" refers to the wavelength on a long-wavelength side of a response curve of the photodetector 10 for which the response of the photodetector 10 is reduced by 50 percent from the peak response of the photodetector. A short cutoff wavelength of the photodetector 10, for which the response of the photodetector 10 is reduced by 50 percent from the peak response on a short-wavelength side of the response curve of the photodetector, can be about 3 μm or less.

Figure 2:
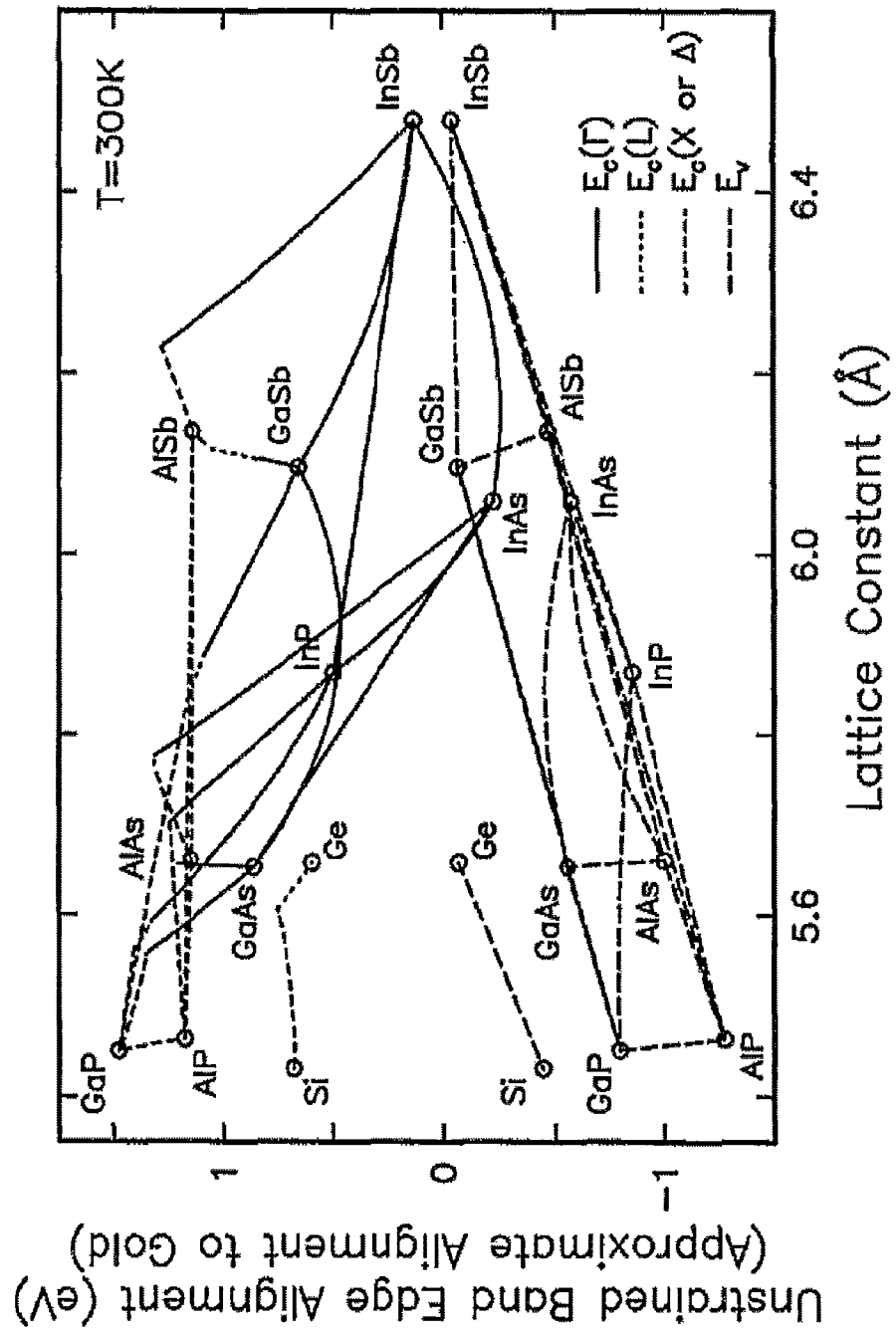
FIG. 2 shows the bandgap energies between the valence and conduction band edges for a III-V alloy system.

FIG. 2 shows the bandgap energies between the valence and conduction band edges for a III-V alloy system including the materials comprising the layers of photodetector 10 in the embodiments of FIGS. 1A and 1B. Such a material system is described in Tiwari and Frank, Appl. Phys. Lett., Vol. 60, No. 5 (1992), the entire contents of which are incorporated herein by reference.

Figure 3:
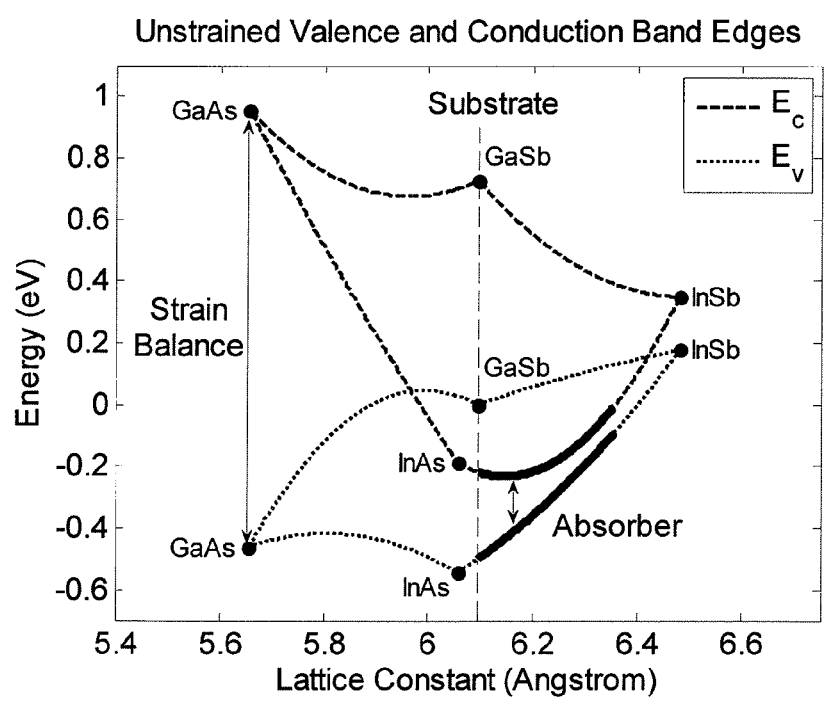
FIG. 3 shows the bandgap energies between the valence and conduction band edges for a GaSb substrate, InAsSb photo-absorbing layers, and GaAs strain-compensating layers, according to the exemplary embodiments of FIGS. 1A and 1B.

FIG. 3 more specifically shows the bandgaps between the valence and conduction band edges for the materials comprising the substrate 12 (GaSb), the photo-absorbing layers 20 (InAsSb), and the strain-compensating layers 22 (GaAs). The data and interpolation scheme for the material system of FIG. 3 is given in Vurgaftman, Meyer and Ram-Mohan, J. Appl. Phys. 89, 5815 (2001), the entire contents of which are incorporated herein by reference. The temperature is taken as 300° K for these calculations. In FIG. 3, the bandgap energy between the valence and conduction band edges of the InAsSb photo-absorbing layers 20 is reduced as the Sb content of the InAsSb alloy increases, and therefore the photo-absorbing layer exhibits a longer absorption cutoff wavelength when the Sb content in the InAsSb alloy is greater. In the embodiments of FIGS. 1A and 1B, the composition of the InAsSb photo-absorbing layers 20 which allows for the absorption of wavelengths greater than 4.5 μm exhibits a lattice constant greater than that of the GaSb substrate 12. Therefore, for the photodetector 10 to exhibit the desired extended cutoff wavelength, the InAsSb photo-absorbing layers 20 of the embodiments of FIGS. 1A and 1B are grown in a lattice-mismatched condition with the substrate 12 such that the photo-absorbing layers 20 are compressively-strained relative to the substrate 12.

The photo-absorbing layers 20 must be grown to have sufficient aggregate thickness in order for the photodetector 10 to absorb infrared light 50 up to the desired extended cutoff wavelength while achieving the required quantum efficiency. However, as the photo-absorbing layers 20 are grown without compensating for the strain caused by the lattice mismatch with the substrate, once a critical thickness is reached the accumulated strain is released by generation of lattice dislocations. If allowed to occur these dislocations result in a decreased quantum efficiency and a higher thermal dark current, decreasing the signal-to-noise ratio for the absorbed infrared light 50. In order to compensate for the strain caused by the photo-absorbing layers 20 being lattice-mismatched to the substrate 12 and therefore avoid generating dislocations due to excess strain, the photo-absorbing region 14 is epitaxially grown on the substrate 12 by alternatingly growing strain-compensating layers 22 interspersed between the photo-absorbing layers 20.

In the embodiments of FIGS. 1A and 1B, the strain-compensating layers 22 are comprised of GaAs, which has a lattice constant of approximately 5.65 Angstroms (Å), less than the lattice constant of 6.09 Å for the GaSb substrate 12, and are therefore tensile-strained. The aggregate tensile strain of the plurality of strain-compensating layers 22 substantially compensates for the aggregate compression strain of the plurality of photo-absorbing layers 20 such that dislocations do not occur in the photo-absorbing layers 20. In certain other embodiments of the present invention to be described in detail hereinafter, materials for the substrate 12, the photo-absorbing layers 20, and the strain-compensating layers 22 may be selected such that the photo-absorbing layers 20 are tensile-strained relative to the substrate 12 and the strain-compensating layers 22 are compression-strained; however, the net strain-balancing effect of the alternating layers within the photo-absorbing regions of these embodiments is substantially the same as that in the embodiments of FIGS. 1A and 1B.

According to the exemplary embodiments of FIGS. 1A and 1B, the photo-absorbing region 14 can have an aggregate thickness from 1 to 10 microns (μm). The InAsSb photo-absorbing layers 20 can each have a thickness of, for example, about 10 nanometers (nm). The thickness of each of the GaAs strain-compensating layers 22 can range from 0.1-1.0 nm. In general, the thickness of each of the photo-absorbing layers 20 can be up to about 100 nm; and the thickness of each of the strain-compensating layers 22 can be up to about 50 nm, the precise thickness depending on the semiconductor material used to form the respective layers. Generally, anywhere from 10 to 2000 pairs of InAsSb photo-absorbing layers 20 and GaAs strain-compensating layers 22 may comprise the photo-absorbing region 14.

The exact thickness of the GaAs strain-compensating layers 22 generally depends upon an amount of tensile strain needed in the strain-compensating layers 22 to compensate for an amount of compressive strain in the InAsSb layers 20, such that a predetermined cutoff wavelength for the photodetector 10 is achieved. Additionally, the thickness of the strain-compensating layers 22 is preferably selected such that the strain-compensating layers 22 are effectively transparent to quantum wavefunctions, enabling the collection of photogenerated minority carriers and the attainment of a photodetector with a higher cutoff frequency at the quantum efficiency required by the system application, where a higher signal to noise is generally preferable. Quantum mechanically transparent thus means that the thicknesses of the strain-compensation layers 22 little to no effect on the transmission of electrons there-through. The thickness of the strain-compensation layers 22, while sufficient to offset the lattice mismatch strain of the absorber 20, are too thin to alter the electron band structure of the absorption material 20 and are not thick enough to have sufficient quantum efficiency.

while sufficient to offset the absorber strain due to lattice mismatch, are thin enough to not sufficiently alter the spectral characteristics of the absorption material 20, such that the absorption material 20 exhibits sufficient quantum efficiency.

In the exemplary embodiments of FIGS. 1A and 1B, and other embodiments to be described hereinafter, the semiconductor layers which form the photodetector 10 can be epitaxially grown on a semiconductor substrate 12 by molecular beam epitaxy (MBE), although other known methods for growing the layers may be used without departing from the scope of the present invention. The semiconductor substrate 12 may be comprised of, for example, gallium antimonide (GaSb) or indium arsenide (InAs) and may be undoped or doped. The InAsSb photo-absorbing layers 20 and the GaAs strain-compensating layers 22 may grown as undoped layers (but which may have a non-intentional residual n-type doping), or the InAsSb photo-absorbing layers 20 and the GaAs strain-compensating layers 22 may be grown as n-type doped layers, although various doping concentrations and p-type dopings may be used without departing from the scope of the present invention as long as the photo-absorbing and strain-compensating layers are substantially strain-balanced such that the photodetector exhibits the extended cutoff wavelength and quantum efficiency characteristics as described herein.

The barrier layer 16 can be epitaxially grown above the photo-absorbing region 14 and can be comprised of aluminum arsenide antimonide ($AlAs_xSb_{1-x}$) having a composition with x generally being in the range $0 \leq x \leq 0.1$. Alternately, the barrier layer can comprise aluminum gallium arsenide antimonide (AlGaAsSb) having a composition $Al_yGa_{1-y}As_xSb_{1-x}$ with $0.5 \leq y < 1.0$ and with $0 \leq x \leq 0.1$. The barrier layer 14 can be undoped, characteristic of a barrier layer in a majority carrier filter photodetector such as disclosed by Maimon. The barrier layer thickness can be approximately 100 nm, for example, although other thicknesses may be considered as long as the reduced dark current properties of a majority carrier filter photodetector are realized.

Ideally, the barrier layer 16 should have a conduction band energy level which is sufficiently high compared to the conduction band energy level of the contact layer 18 to limit a thermal excitation of the majority carriers from the contact layer 18 over the barrier layer 16 at an operating temperature of the photodetector 10, and should be sufficiently thick to limit a tunneling of majority carriers (i.e. electrons) through the barrier layer 16. Additionally, the semiconductor alloy composition of the barrier layer 16 should be selected to provide a valence band energy level that is substantially equal to the valence band energy level of the InAsSb photo-absorbing layers 20. This allows minority carriers (i.e. holes), which are photogenerated in the photo-absorbing region 14 as incident infrared light 50 is absorbed, to flow with minimal bias voltage across the barrier layer 16 to the contact layer 18 and thereby contribute to the electrical output signal of the photodetector 10. Thus, as the amount of Sb content in the InAsSb photo-absorbing layers 20 is increased to shift the cutoff wavelength of the photodetector 10 to a longer wavelength in the range of 4.5 μm or more, the semiconductor alloy composition and strain of the barrier layer 16 can be adjusted to maintain a substantially zero offset between the valence band energy levels of the barrier layer 16 and the photo-absorbing layers 20.

In the embodiments of FIGS. 1A and 1B and the other embodiments of the present invention to be discussed hereinafter, the barrier layer 16 can also act as a passivation layer to suppress surface currents due to the majority carriers, as disclosed by Maimon in U.S. Pat. No. 7,687,871. By suppressing surface currents and blocking a flow of the majority carriers from the contact layer 18 into the photo-absorbing region 14, the barrier layer 16 substantially reduces a dark current in an electrical output signal of the photodetector 10.

In the exemplary embodiments of FIGS. 1A and 1B, the contact layer 18, which is grown above the barrier layer 18, can comprise InAs, GaSb, or InAsSb. A first-grown portion of the contact layer 18 can be undoped (i.e. not intentionally doped) with the remainder of the contact layer 18 being n-type doped (e.g. with silicon) during epitaxial growth. Other dopings such as p-type doping, as well as various doping concentrations may be used as long as the preferred reduced dark current characteristics of a majority carrier filter photodetector are realized. An overall thickness of the contact layer 18 can be, for example, 100 nm. When the InAsSb photo-absorbing layers 20 and the contact layer 18 are both n-type doped and the barrier (B) layer 16 is undoped, the photodetector 10 in FIGS. 1A and 1B can be referred to as an nBn photodetector.

Figure 4:
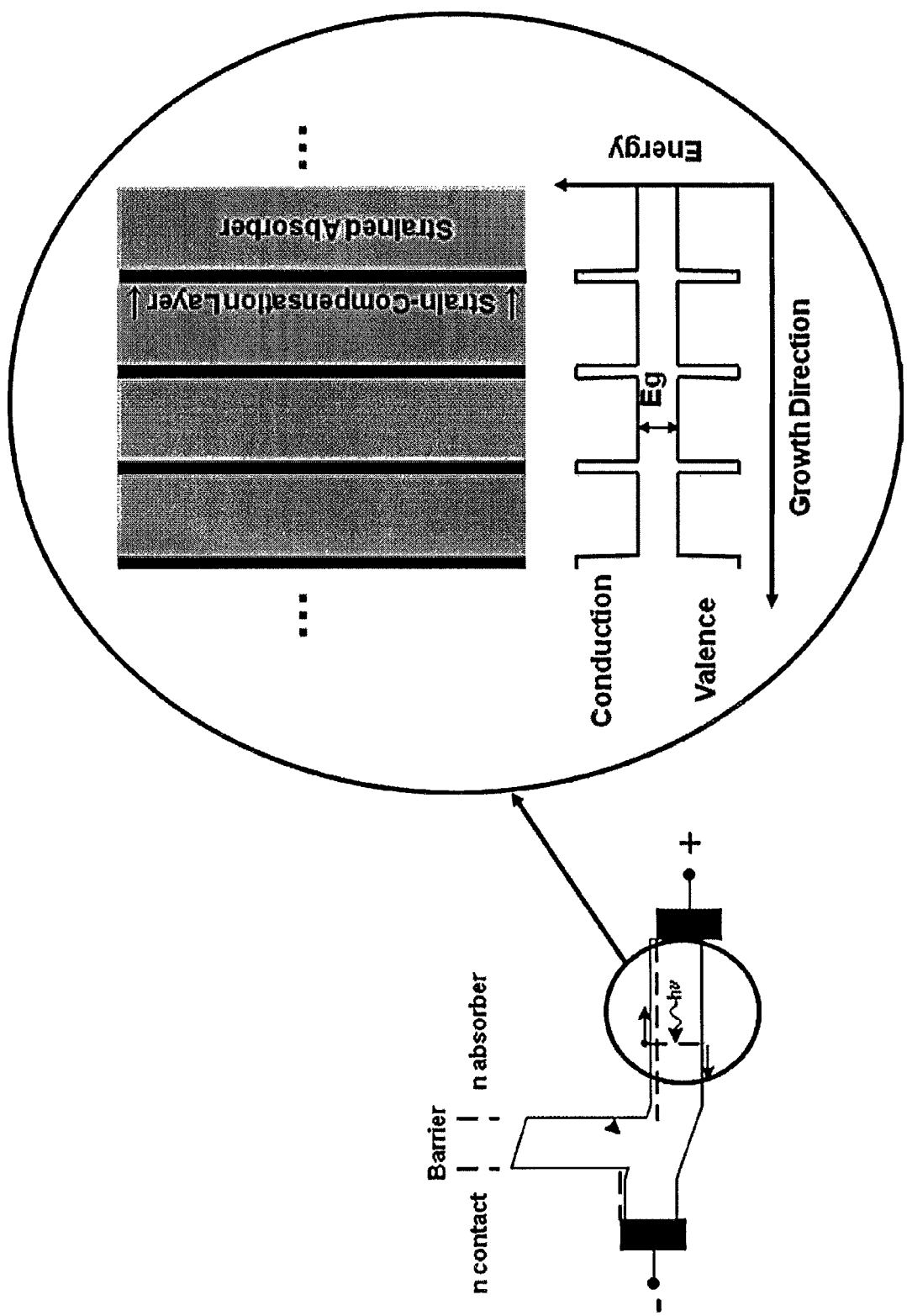
FIG. 4 shows the conduction and valence energy bands of the photo-absorbing layers and the strain-compensating layers for an exemplary embodiment of the present invention.

FIG. 4 shows an exemplary embodiment of the present invention wherein the photodetector 10 has a majority carrier filter structure. FIG. 4 shows the conduction and valence energy bands of the photo-absorbing layers 20 and the strain-compensating layers 22, and in particular, depicts the increased bandgap energy of the strain-compensating layers 22 with respect to the bandgap energy of the photo-absorbing layers 20.

Figure 5:
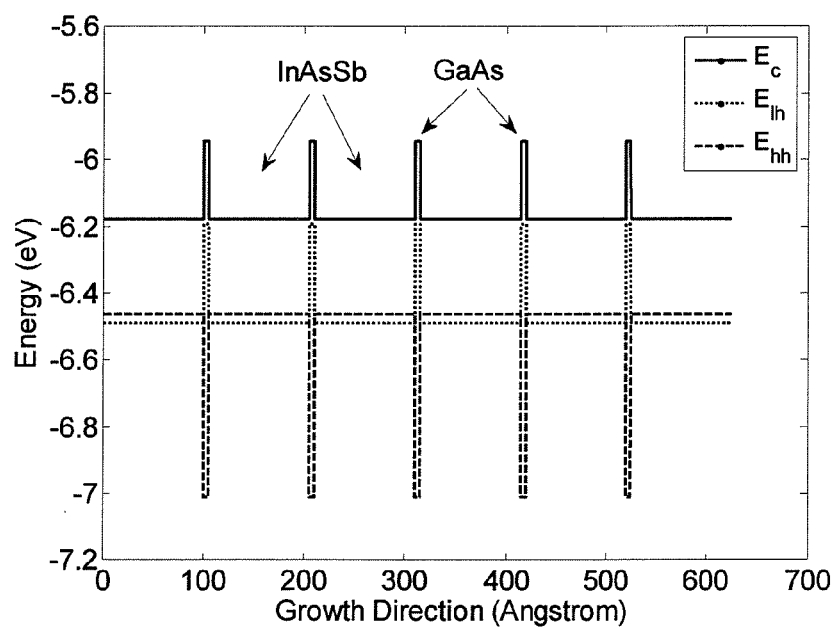
FIG. 5 shows the band edge energies versus growth direction for an exemplary embodiment of the present invention comprising InAsSb photo-absorbing layers and GaAs strain-compensating layers.
Figure 6:
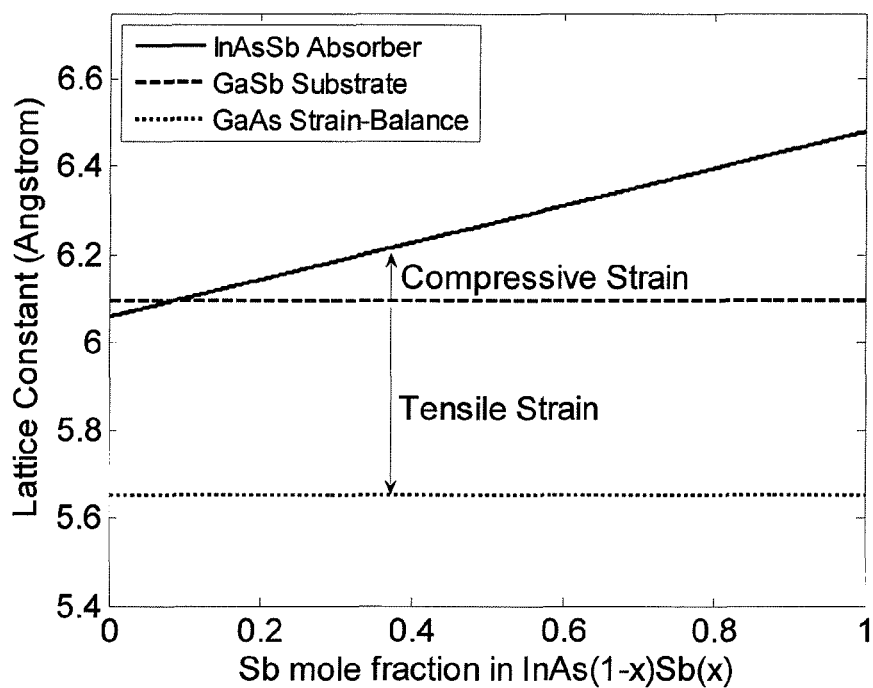
FIG. 6 shows the relationship between the compressive strain and tensile strain of the respective InAsSb photo-absorbing layers and GaAs strain-compensating layers with respect to a GaSb substrate, in the exemplary embodiments of the present invention.

FIG. 5 shows a more specific example of the band edge energies versus growth direction for the exemplary embodiment with InAsSb photo-absorbing layers and GaAs strain-compensating layers. The GaAs layers are thin potential barriers for electron transport in the growth direction. Because both materials are strained relative to the GaSb substrate, the valence band splits into heavy and light hole bands. This results in the GaAs layers presenting potential barriers for heavy hole transport, while for light holes the GaAs layer is a potential well relative to the absorber band edge. Since a bandgap energy of the strain-compensating layers 22 is larger than that of the InAsSb light-absorbing layers 20, the carriers (i.e. electrons and holes) that are photogenerated in the light-absorbing region 14 in response to absorbed infrared light 50 must be conducted across the strain-compensating layers 22 via quantum tunneling and/or thermal excitation to generate an electrical output signal for the photodetector 10.

In the embodiments of FIGS. 1A and 1B, a top electrode 24 is provided on the contact layer 18. The top electrode 24 can be formed of any arbitrary shape (e.g. square, polygonal, circular, etc.) and can be comprised of materials known in the art for use with the particular semiconductor materials described herein. As an example, the top electrode 24 can comprise Ti/Ni formed by depositing 300 Å of Titanium (Ti) followed by 1000 Å of Nickel (Ni) or Ge/Au/Ni/Au metallization formed by depositing 26 nm of germanium (Ge), 54 nm of gold, 15 nm of nickel (Ni) and 200 nm of gold in that order.

In the example of FIG. 1A, a bottom electrode 26 can be deposited over a portion of the bottom surface of the GaSb substrate 12 such that it is connected electrically to the photo-absorbing region 14 through the substrate 12. The bottom electrode 26 can be comprised of materials as described previously with respect to the top electrode 24. In a backside-illuminated arrangement as is known in the art, infrared light 50 impinging on the photodetector can be transmitted through the GaSb substrate 12 to the photo-absorbing region 14 through an opening 34 formed through the bottom electrode 26, as shown in FIG. 1A. Alternately, in a topside-illuminated arrangement (not shown) as is known in the art, the top electrode 24 can be formed in an annular shape such that infrared light 50 is absorbed into the photo-absorbing region 14 from a top side of the substrate 12. In a preferred embodiment, shown in FIG. 1B, both electrodes 24 and 26 are formed on the top side of the photodetector. In this embodiment, portions of the contact layer 18 and the barrier layer 16 are sufficiently laterally removed from the etch down to the absorber top surface 30 such that the detector dark current is not increased.

In the exemplary embodiments of FIGS. 1A and 1B, the contact layer 18 is selectively etched down to the barrier layer 16 to define a lateral extent of the photodetector 10. The selective etching can be performed, for example, using a wet etchant comprising a solution of citric acid and hydrogen peroxide. The selective etchant does not substantially etch the AlAsSb or AlGaAsSb used for the barrier layer 16, such that the etching process stops at the barrier layer 16. In this manner, the etched contact layer 18 forms a mesa on the barrier layer 16 such that the barrier layer laterally extends beyond the contact layer 18, thereby passivating the photodetector 10 during operation by preventing majority carriers from flowing to exposed surfaces of said barrier layer 16.

In the preferred embodiment of FIG. 1B, a via 34 can be etched in the barrier layer 16 using a non-selective etch that is timed to etch to the photo-absorbing layer 14. The bottom electrode 26 is then deposited into the via 34. Other etching methods and placement locations for the bottom electrode 26 may also be used in addition to those described herein without deviating from the inventive concepts described herein.

Figure 14:
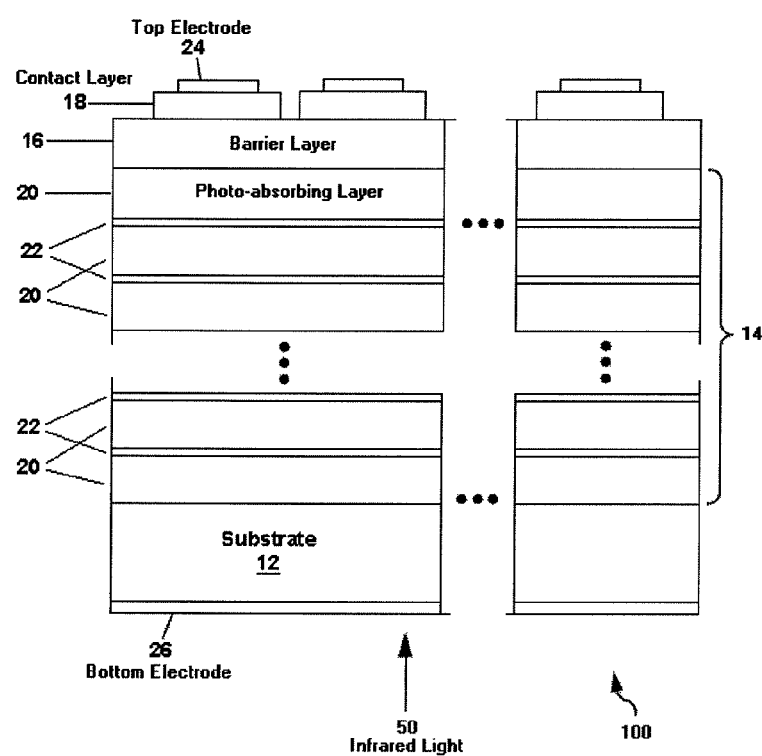
FIG. 14 shows a schematic cross-section view of another embodiment of the present invention in which a focal plane array is formed as a matrix of strain-balanced photodetectors formed according to the embodiments of the present invention.
Figure 15A:
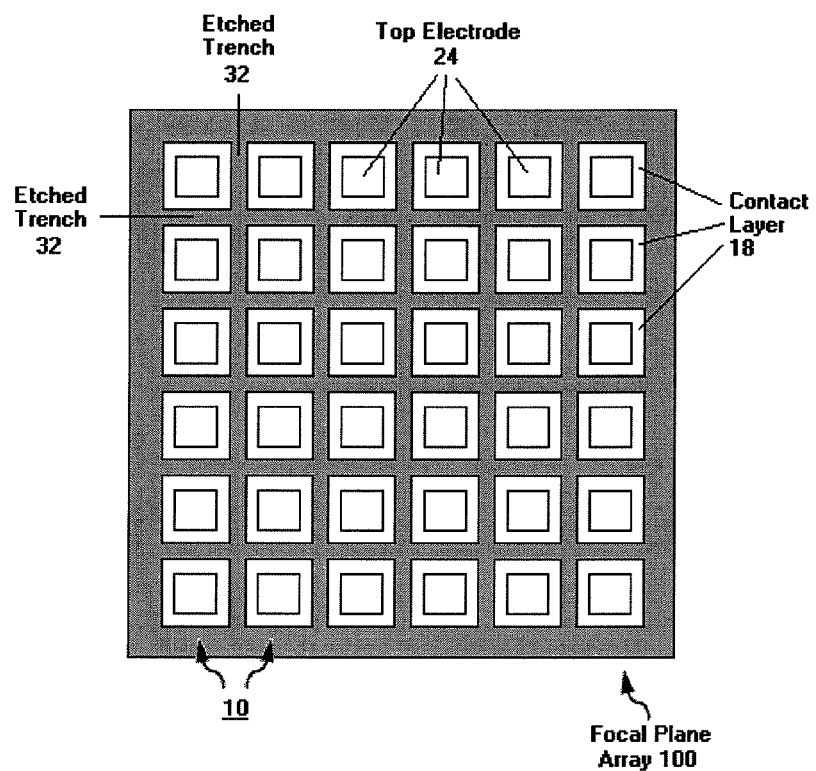
FIG. 15A shows a schematic top view of the focal plane array according to the embodiment of FIG. 14.

In another embodiment of the present invention as shown in FIG. 14, a plurality of photodetectors 10 are formed on a common semiconductor substrate 12 so as to form a focal plane array 100 of photodetectors 10. FIG. 15A shows a top schematic view of the focal plane array 100 in which the contact layer 16 is shown as selectively etched down to the barrier layer 16 to form individual sections delineated by etched trenches 32, which define a lateral extent of each of the photodetectors 10. In this embodiment, the barrier layer extends past the individual sections of the contact layer in a lateral direction across the photodetector, and is monolithically provided for each of the individual photodetectors 10, thereby passivating the photodetectors 10 during operation by blocking the flow of majority carriers to exposed surfaces of said barrier layer 16.

Figure 15B:
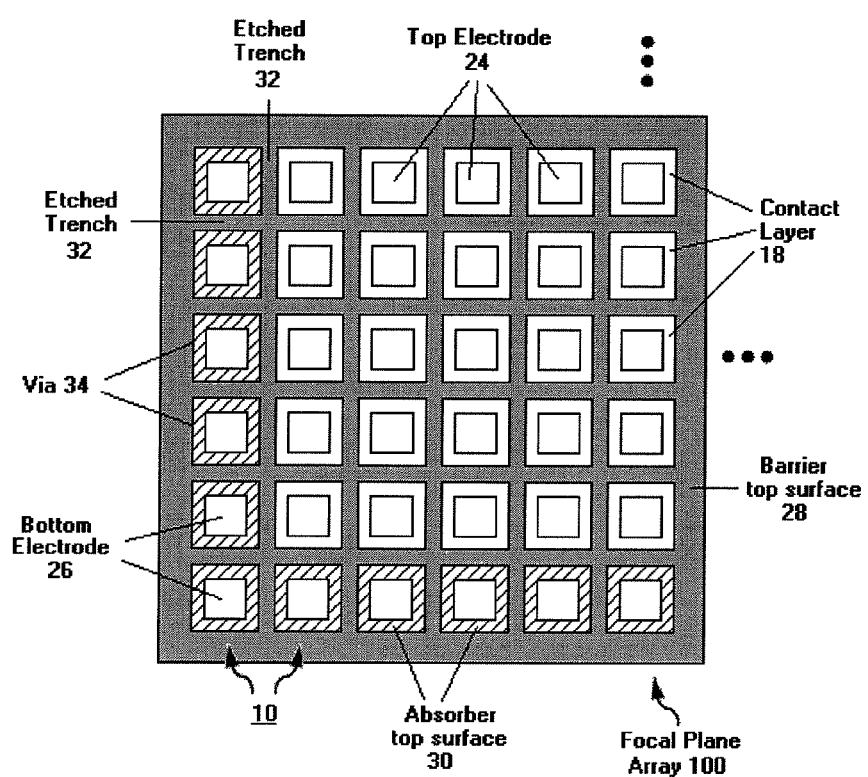
FIG. 15B shows a schematic top view of an alternate embodiment of the focal plane array of FIG. 14, wherein both electrodes are disposed on the topside of the photodetector according to the embodiment of FIG. 1B.

In the preferred embodiment of FIG. 15B, the construction follows the array as in FIG. 15A but a via 34 is etched as in FIG. 1B around the periphery of the array. With both contacts 24 and 26 disposed on the top side of the photodetector, indium bumps can be deposited and the array can be hybridized to a readout integrated circuit (ROIC) in the manner known to those skilled in the art. With the backside clear for thinning and antireflection coatings, the quantum efficiency of the photodetector is maximized while the processing is simplified. In some cases the wafer substrate may be partially or completely removed prior to the application of an antireflection coating.

The photodetector 10 formed according to the exemplary embodiments of FIGS. 1A and 1B can be operated with a small reverse-bias applied between the electrodes 24 and 26. When infrared light 50 is absorbed, electrons and holes are photogenerated within the photo-absorbing region 14 and flow to the bottom electrode 26 under an electric field generated by the applied reverse-bias voltage, where they are collected to constitute part of the output signal from the photodetector 10. The photogenerated holes move in an opposite direction and are collected in the contact layer 18 to further contribute to the electrical output signal of the photodetector 10. Because of the quantum-mechanical transparency of the strain-compensating layers 22, the photogenerated electrons and holes are conducted through the strain-compensating layers 22 by tunneling and/or thermal excitation.

According to aspects of the majority carrier filter photodetector of the present invention, the barrier layer 16 exhibits a valence band energy level substantially the same as that of the adjacent photo-absorbing layer 20 such that conduction of the photogenerated holes across the barrier layer 16 to the contact layer 18 is not impeded. On the other hand, there exists a substantial offset in the conduction band between the conduction band energy level of the barrier layer 16 and the conduction band energy level of the contact layer 18. This substantial offset in the conduction band energy levels between the barrier layer 16 and the contact layer 18 is effective to substantially limit the flow of majority carrier electrons across the barrier layer 16 from the contact layer 18 to the photo-absorbing region 14. This has the beneficial effect of a greatly reduced dark current noise level in the output signal from the photodetector 10. The barrier layer 16 also acts as a passivation layer for the photodetector 10, as disclosed by Maimon, effectively limiting surface currents which also contribute to the dark current in conventional photodetectors.

By providing the strain-compensating layers 22 in the photo-absorbing region 14, the InAsSb photo-absorbing layers 20 can be oppositely strained (i.e. compressively strained) by increasing the amount of antimony in the layers 20; and this compressive strain in the light-absorbing layers 20 can be accommodated. Increasing the amount of antimony in the InAsSb photo-absorbing layers 20 is advantageous to extending the cutoff to longer wavelengths for the detection of infrared light 50 in the photodetector 10. With the layers 20 and 22 being oppositely strained, an overall strain in the photo-absorbing region 14 can be balanced and minimized when averaged over a number of the layers 20 and 22 so that an effective lattice constant for the photo-absorbing region 14 is about the same as the lattice constant of the semiconductor substrate 12. In this way, the photo-absorbing region 14 can be substantially lattice-matched to the substrate 12. These properties of the exemplary embodiment of the present invention are described in more detail hereinafter.

As discussed above, in order to achieve a substantially strain-balanced state for the photo-absorbing region 14, the photo-absorbing region 14 must have an overall effective lattice constant equal (or very close to) the lattice constant of the substrate. For a photo-absorbing region composed of photo-absorbing layers of material "a" and strain-compensating layers of material "b," the effective lattice constant of the photo-absorbing region 14 is given by $$a_{\mathit{eff}} = (a_a t_a + a_b t_b)/(t_a + t_b) \tag{1}$$

where $a_{\mathit{eff}}$, $a_a$, and $a_b$ are the lattice constants for the photo-absorbing region 14, the photo-absorbing layers 20, and the strain-compensating layers 22, respectively; and $t_a$ and $t_b$ are the thicknesses of the individual photo-absorbing and strain-compensating layers, respectively. Solving this equation for the ratio of the thicknesses results in $$\frac{t_a}{t_b} = \frac{a_b - a_{\mathit{eff}}}{a_{\mathit{eff}} - a_a}. \quad (2)$$

To achieve ideal strain-balancing, the effective lattice constant of the photo-absorbing region 14 is set equal to that of the substrate 12. The condition for the ratio of thicknesses becomes $$\frac{t_a}{t_b} = \frac{a_b - a_{\mathit{substrate}}}{a_{\mathit{substrate}} - a_a}. \quad (3)$$

Therefore, the optimal thickness ratio between the photo-absorbing layers and the strain-compensating layers which achieves strain-balancing for the photo-absorbing region can be determined from the lattice constants for a particular substrate semiconductor material, strain-compensating material, and photo-absorbing material composition. Furthermore, the choice of the photo-absorbing material composition depends on the desired absorption cutoff wavelength for the photodetector. As previously discussed with respect to the embodiments of FIGS. 1A and 1B, for example, an increase in the Sb content of an InAsSb absorber reduces the bandgap energy for the absorber and extends the cutoff frequency to a particular value. The lattice constant of InAs(1−x)Sb(x) absorber material is calculated given the material temperature and composition. The composition is denoted by the antimony mole fraction, x. Assuming GaAs strain-compensating layers and a GaSb substrate, the ratio of layer thicknesses is calculated using expression (3) above.

Thus, according to the present invention, the III-V semiconductor alloy composition of the InAsSb light-absorbing layers 20 can be $InAs_xSb_{1-x}$ with $0 \leq X \leq 0.9$ to provide a longer cutoff wavelength for the photodetector 10 which is at a predetermined wavelength in the range of 4.5 µm or more at an operating temperature of, for example, 160° K or less.

Figure 7:
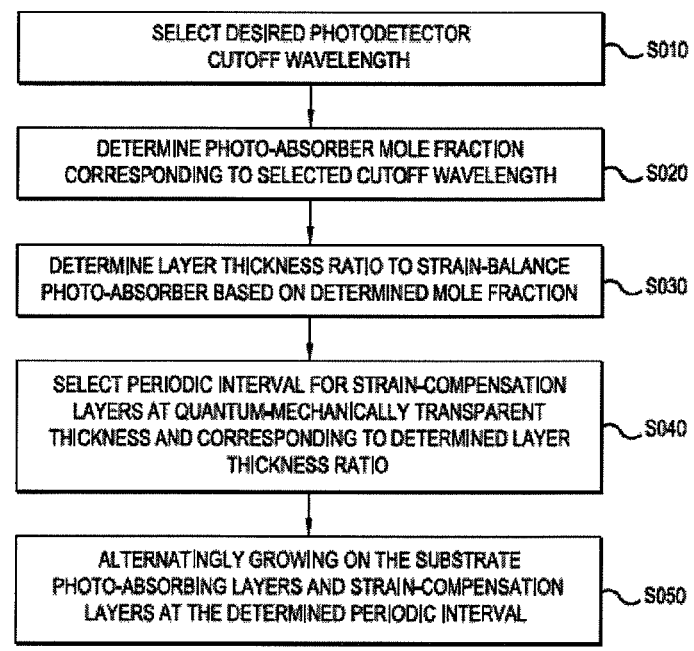
FIG. 7 shows an exemplary method of designing an extended wavelength photodetector to have strain-compensation characteristics that achieve a particular cutoff wavelength while maintaining reasonable quantum efficiency.

FIG. 7 shows an exemplary method of designing an extended wavelength photodetector with particular strain-compensation characteristics in order to achieve a particular cutoff wavelength while maintaining reasonable quantum efficiency. In a particular example, in order to compensate for the strain of the InAsSb absorber layers 20 enough to effect a particular desired cutoff wavelength, a period for the strain-compensated pulses can be determined according to the method, as discussed below.

Figure 8:
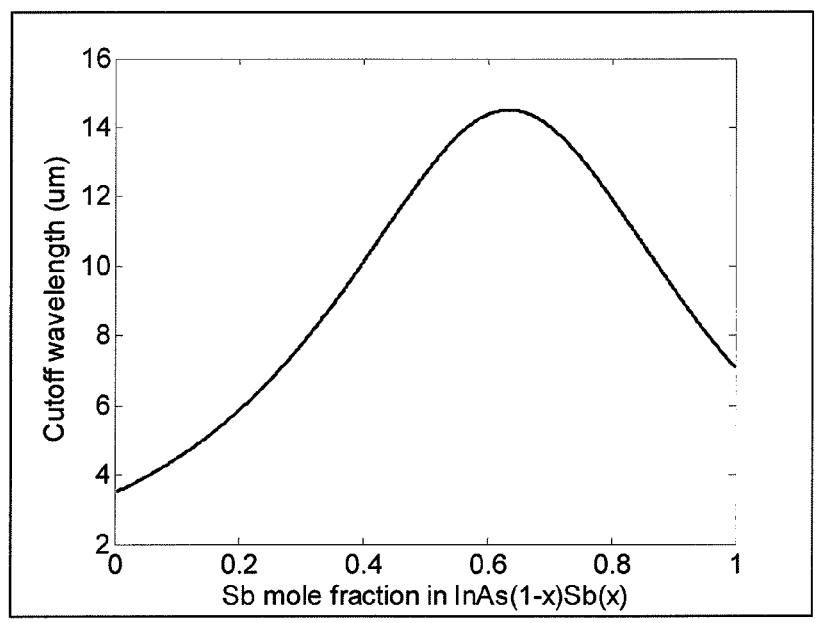
FIG. 8 shows the relationship between the Sb mole fraction and the cutoff wavelength for $InAs(1-x)Sb(x)$.
Figure 9:
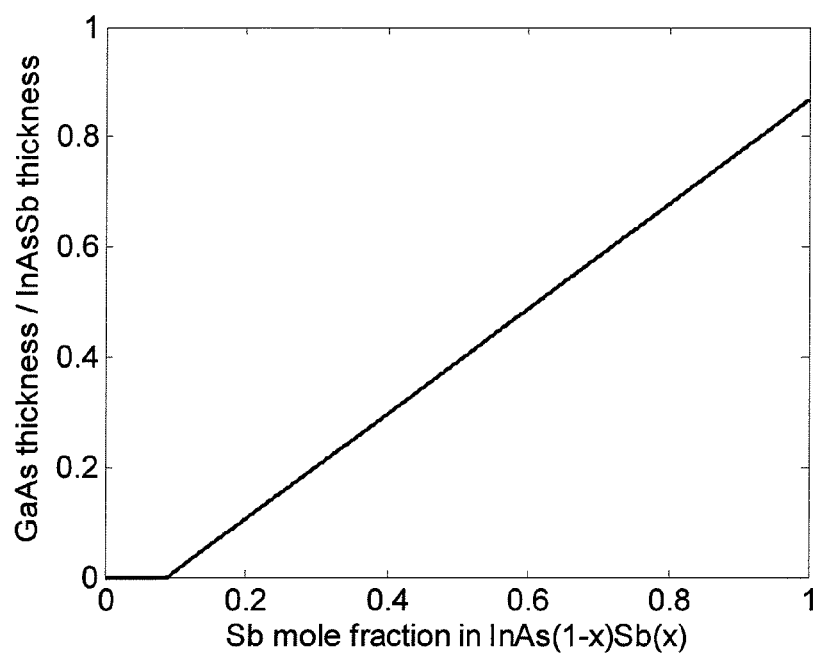
FIG. 9 shows the relationship between the Sb mole fraction and the thickness ratio between the InAsSb photo-absorbing layers and the GaAs strain-compensating layers in the exemplary embodiments of FIGS. 1A and 1B.

In step S010, a particular desired cutoff wavelength is selected for the photodetector. In step S020, based on the desired cutoff wavelength, the corresponding Sb mole fraction for InAsSb that absorbs infrared light up to the desired cutoff wavelength is determined, for example, according to the relationship between the Sb mole fraction and the cutoff wavelength for InAs(1−x)Sb(x). This relationship is depicted in FIG. 8. Next, in step S030, the ratio of layer thickness that achieves an effective lattice constant for the photo-absorbing region 14 that is substantially similar to the lattice constant of the substrate material (and thereby achieves strain-balancing of the photo-absorbing layer 14) is determined according to the lattice constant of InAsSb having the determined Sb mole fraction, the lattice constant of the GaSb substrate, and the lattice constant of the GaAs strain-compensating layers based on the expression (3) described above. The relationship between the Sb mole content and the thickness ratio is shown in FIG. 9 for the particular materials of the embodiments of FIGS. 1A and 1B. Then, in step S040, a periodic interval for the GaAs strain-compensating layers is selected such that the strain-compensating layer thickness remains effectively quantum mechanically transparent without introducing significant confinement energy that offsets the wavelength extension from the change in photo-absorber composition and thereby do not significantly affect the spectral properties of the overall photo-absorbing region. Finally, in step S050, the photo-absorbing layers and strain-compensation layers are alternatingly grown on the substrate at the determined periodic interval and at a quantum-mechanically transparent thickness.

Figure 20:
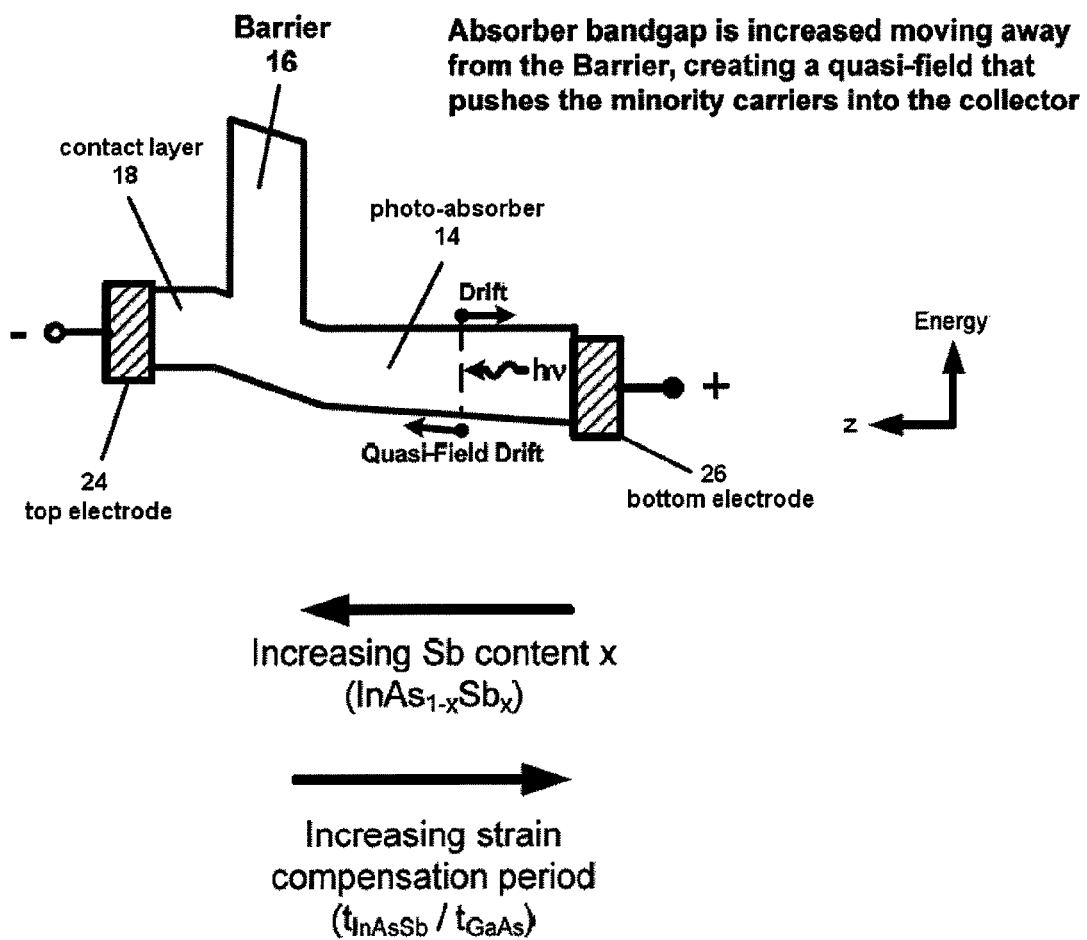
FIG. 20 shows a majority carrier filter photodetector according to further embodiments of the present invention where the photo-absorber bandgap has been graded by increasing the Sb content of the absorber in the direction toward the barrier so as to drive minority carriers towards the barrier, wherein the graded photo-absorber is strain-balanced according to a further embodiment of the present invention.

A particular example of the method of FIG. 7 will be more specifically described herein. First, a desired cutoff wavelength of 5 µm is chosen. Next, from FIG. 8, the Sb content x corresponding to a cutoff wavelength of 5 µm is approximately 0.14. From FIG. 9, x=0.14 corresponds to a thickness ratio of approximately 0.05. Therefore, for GaAs strain compensating layers with a thickness of 5 Å, for example, the thickness for the InAs(0.86)Sb(0.14) photo-absorbing layers corresponds to 100 Å, although other thicknesses corresponding to the ratio of 0.05. A photo-absorbing region grown with these characteristics exhibits an absorption cutoff wavelength very close to that of the bulk ternary InAs(0.86)Sb (0.14) material, with greater quantum efficiency as the GaAs strain-compensating layers are selected to be thinner. FIG. 20 depicts measured data confirming that the cutoff wavelength is extended to 5 µm. Although the materials for the preferred embodiments of FIGS. 1A and 1B are used in this example, a skilled artisan will recognize that this method is not limited to these materials and is readily applicable to other comparable materials.

Figure 10:
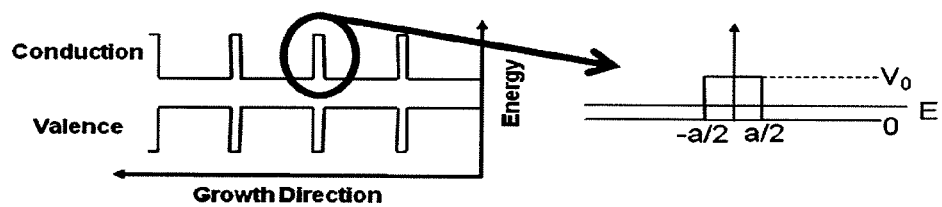
FIG. 10 shows the relationship between the thickness of the potential barrier or well for the strain-compensating layers, the height of the potential barrier or depth of the well relative to the absorber band edge, and the energy of a particle relative to the absorber band edge, according to aspects of the present invention.

Further explanation of the desirability of selecting the strain-compensating layer thickness is provided herein. The analysis of carrier transport through potential barriers is well known, for example "Quantum Mechanics," Cohen-Tannoudji, Hermann, Paris, France 1977, pp 67-78, the entire contents of which are incorporated herein by reference. Referring to FIG. 10, the quantum mechanical solution to transmission of carriers through potential barriers and wells is given by $$T(E) = \frac{(2k\kappa)^2}{(k^2 + \kappa^2)^2 \sinh^2(\kappa a) + (2k\kappa)^2} \quad (4)$$

with $$\kappa = \sqrt{2m(V_0 E)}/\eta \quad (5)$$

and $$k = \sqrt{2m(E)}/\eta \quad (6)$$

where m is the mass of the particle, a is the thickness of the barrier or well, $V_o$ is the height of the potential barrier or depth of the well relative to the absorber band edge, and E is the energy of the particle relative to the absorber band edge. In the case of an electron in a heterostructure, the particle mass is known as the effective mass. See, for example, "Principles of the Theory of Solids," J. M. Ziman, Cambridge University Press, Cambridge, England, 1972, the entire contents of which are incorporated herein by reference. The solutions to the crystal potentials result in different effective masses near the conduction (electrons) and valence (holes) band edges.

Figure 11:
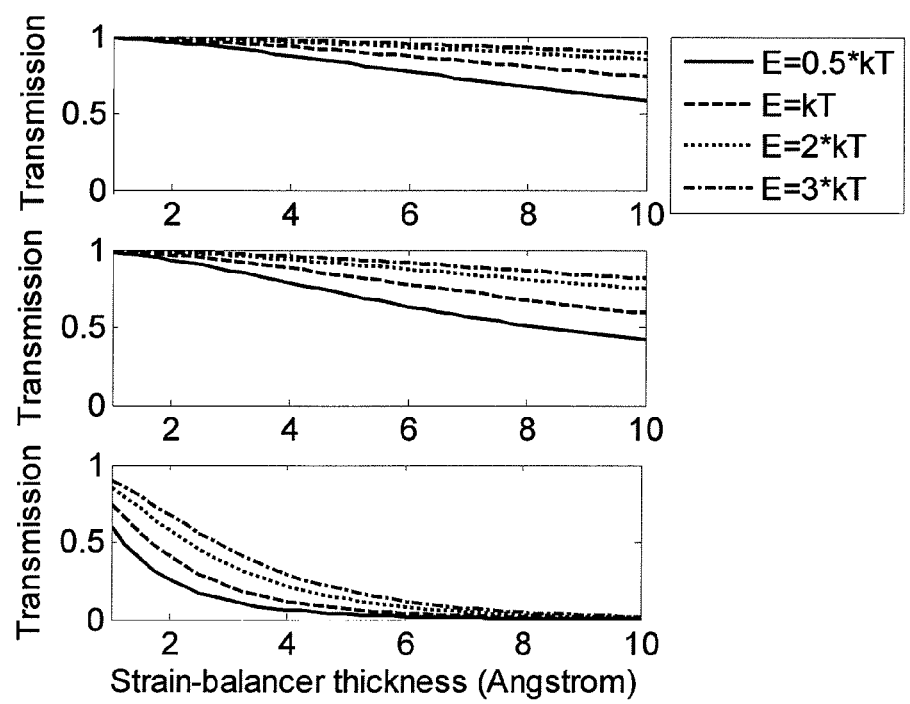
FIG. 11 shows the transmission characteristics for electrons (top), light holes (middle), and heavy holes (bottom) as a function of the thickness of the strain-compensating layers, according to calculations based on expressions (4), (5), and (6) as described herein.

Results of the transmission calculations are shown in FIG. 11 for electrons (top), light holes (middle) and heavy holes (bottom). The particle energies are chosen to be 0.5*kT, kT, 2*kT and 3*kT above the ternary band edges. The temperature is taken as 200° K. The strain-compensating layers are GaAs with thicknesses from 1-10 Å. For each GaAs layer thickness in the plots, the InAsSb composition is chosen to strain-balance the photo-absorbing region relative to a GaSb substrate. As expected, the transmission decreases with increasing GaAs thickness. Transmissions of ~50% for GaAs layers of 10 Å or less are quite acceptable. While the heavy hole transmission drops rapidly, the band mixing at the heterointerfaces ensure that the hole carrier transport will be sufficient to ensure detector operation.

Figure 12:
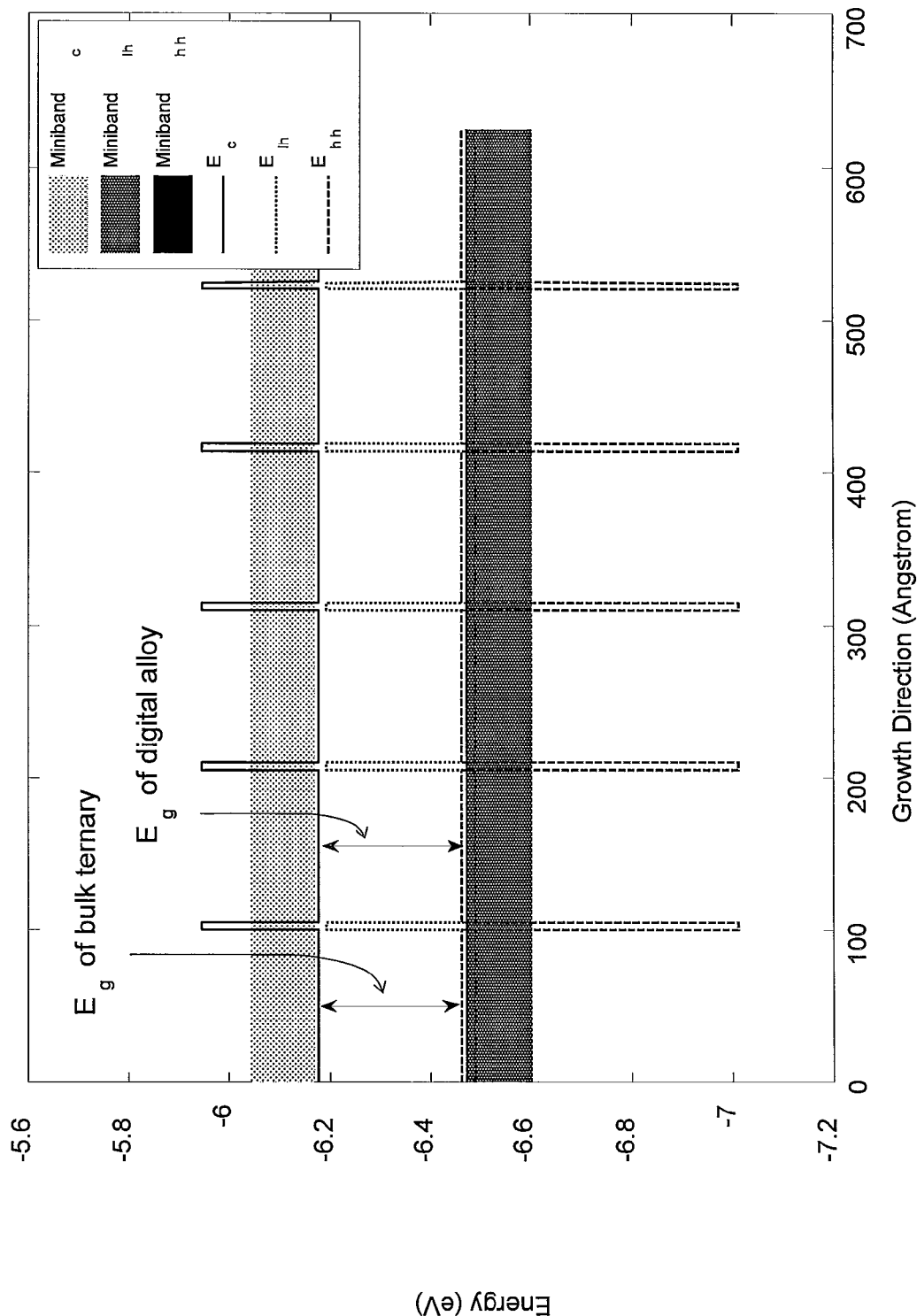
FIG. 12 shows a plot of the mini-bands along with the band edges along the growth direction, according to aspects of the present invention.

A more complete theoretical basis for digital alloy design can be found in mini-band theory. Assuming an infinite lattice, Kronig-Penney solutions are used to calculate the modes and mini-bands. The mini-bands are plotted in FIG. 12, along with the band edges along the growth direction. From FIG. 12, the energy gap (and hence the absorption cutoff wavelength) is nearly the same for the photo-absorbing region (including the strain-compensating layers) as for a bulk ternary absorber material without any strain-compensating layers. Thus, thin layers of the strain-compensating material do not substantially alter the absorption characteristics of the ternary material.

The two hole band maxima are essentially at the same energy value, therefore the absorbed light will generate both light and heavy holes available for transport, unlike most super-lattices where the confinement energy places the heavy holes closer to the band edge than the light holes. This energy overlap of heavy and light holes allows for scatter transfer and improves the overall diffusion transport of photo-generated carriers in a majority-carrier filter photodetector.

Figure 13:
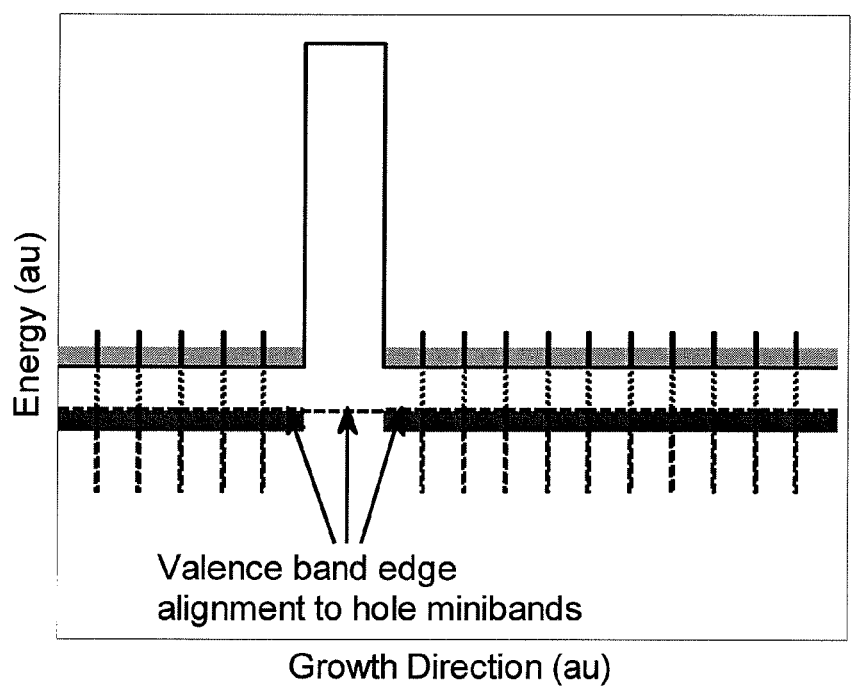
FIG. 13 shows an example of band edge alignment between the hole mini-bands and the barrier valence band edge, according to aspects of the present invention.

An important consideration for the transport of holes is the band edge alignment between the hole mini-bands and the barrier valence band edge, as shown in FIG. 13. According to aspects of the present invention, band edge alignment can be achieved by proper choice of the barrier material, and by choosing the ratio of widths for the alternating layers of the photo-absorbing region 14. When the thickness of the strain-compensating layers 22 is kept below a critical thickness such that they are substantially quantum-mechanically transparent, both strained and unstrained photo-absorber regions may be used to modify the valence band edge of the barrier layer. This means that the composition of the contact layer may also be formed to comprise alternating photo-absorbing layers and strain-compensating layers similarly to that of the photo-absorbing region 14 of FIG. 1.

Figure 18:
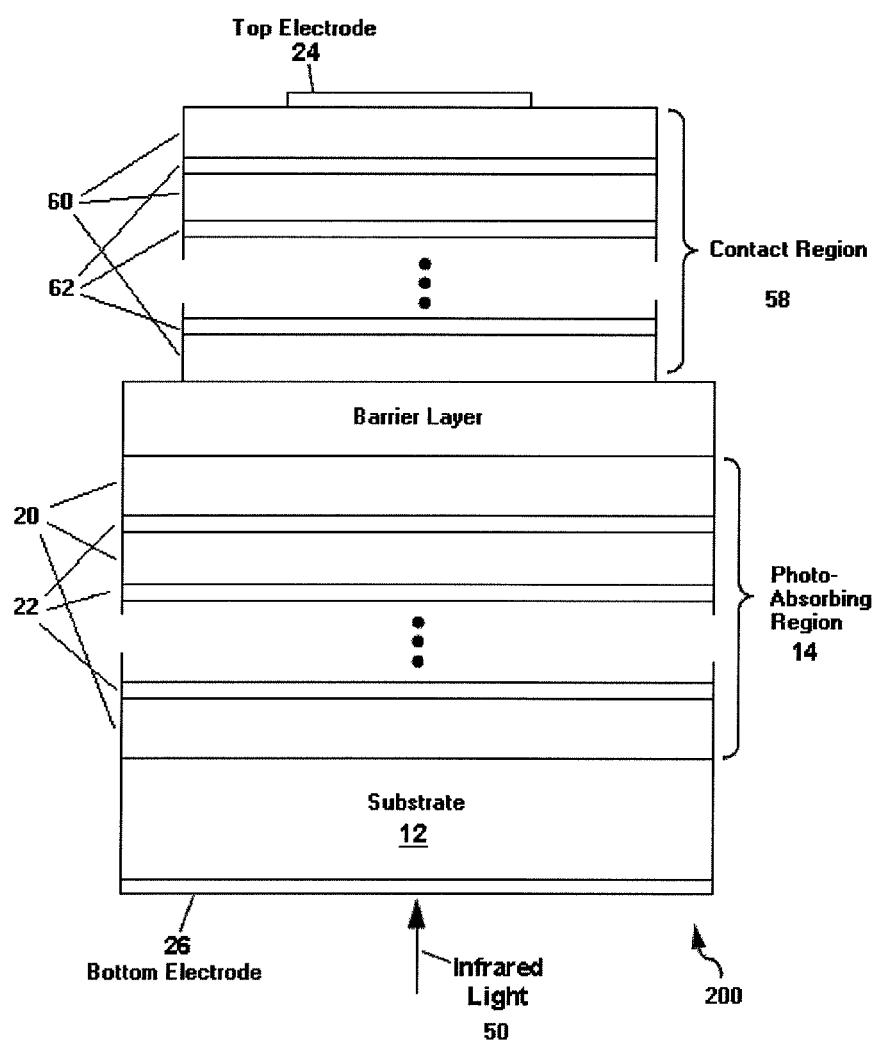
FIG. 18 shows a schematic cross-section view of a photodetector according to a further embodiment of the present invention in which the contact layer region is strain-balanced by alternating strain-compensating layers and photo-absorbing layers.

Accordingly, FIG. 18 shows an alternative embodiment of the present invention in which, in addition to providing a strain-balanced structure for photo-absorbing region 14, contact layer region 58 is also formed to have a strain-balanced structure. Thus, it can be appreciated that, for any mention of a "contact layer" in any of the foregoing and ensuing description within the instant disclosure, one of ordinary skill in the art will understand that such a contact layer may be formed of a strain-balanced construction, e.g., as shown in FIG. 18, while remaining a part of the inventive concept as described herein. Additionally, such a strain-balanced contact layer may alternatively be referred to as an additional photo-absorbing region formed above the barrier layer, without departing from the scope of the present invention. Further embodiments of the present invention with respect to a strain-balanced contact layer are described in greater detail hereinafter with respect to FIG. 18.

FIG. 18 shows a schematic cross-section view of a strain-balanced two-color photodetector according to an embodiment of the present invention. In FIG. 18, photo-absorbing region 14 is located on substrate 12 and is comprised of alternating layers of a plurality of first photo-absorbing layers 20 and a first plurality of strain-compensating layers 22. A barrier layer 16 is located above the photo-absorbing region 14. A contact region 58 is disposed on the barrier layer 16 and comprises alternating layers of a plurality of second photo-absorbing layers 60 and a second plurality of strain-compensating layers 22. For a photodetector formed to have such a construction, the contact layer region 58 may be comprised of alternating layers of, e.g., InAsSb photo-absorbing layers and GaAs strain-compensating layers, comparable to the photo-absorbing region 14 in the example of FIG. 1, and may exhibit conduction and valence bandgap energies as depicted in FIG. 13. As discussed further below, and as will be appreciated by one of ordinary skill in the art, alternative material systems exhibiting different tailorable cutoff wavelengths may be used.

Figure 16:
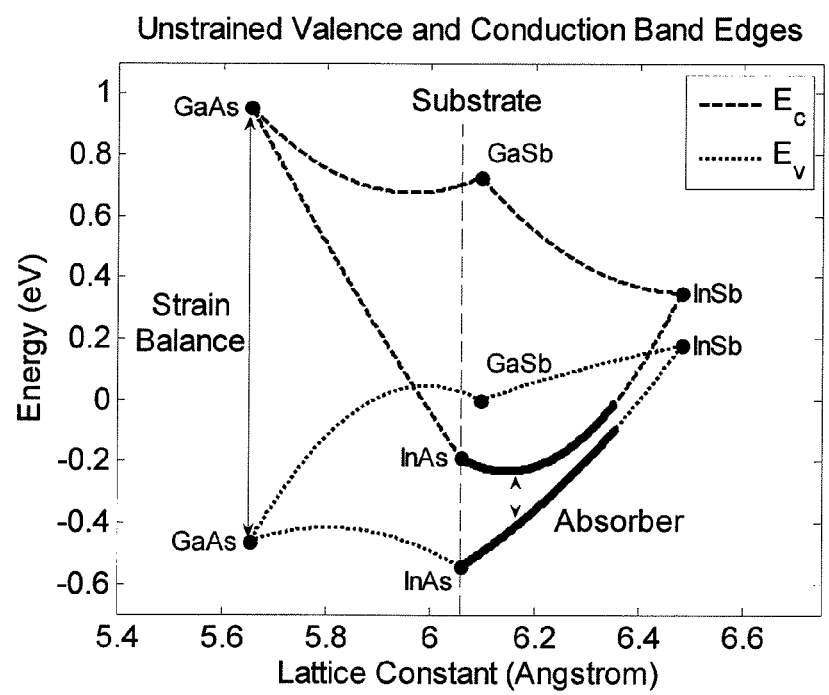
FIG. 16 shows the band edge energies between the valence and conduction band edges for an InAs substrate, InAsSb photo-absorbing layers, and GaAs strain-compensating layers, according to an alternative embodiment of the present invention.

FIG. 16 shows an example of a material system corresponding to an alternative embodiment of the present invention in which the substrate is comprised of InAs instead of the GaSb as in the embodiments of FIGS. 1A and 1B. This enables the InAsSb ternary absorber to achieve absorption cutoff from that of InAs through the maximum achievable from InAsSb, all on the same substrate and with the same choice of GaAs strain-compensating material. FIG. 16 shows the bandgap energies between the valence and conduction band edges for an InAs substrate, InAsSb photo-absorbing layers, and GaAs strain-compensating layers, wherein the InAsSb absorber layers are compressively strained as the antimony content is increased.

Figure 17:
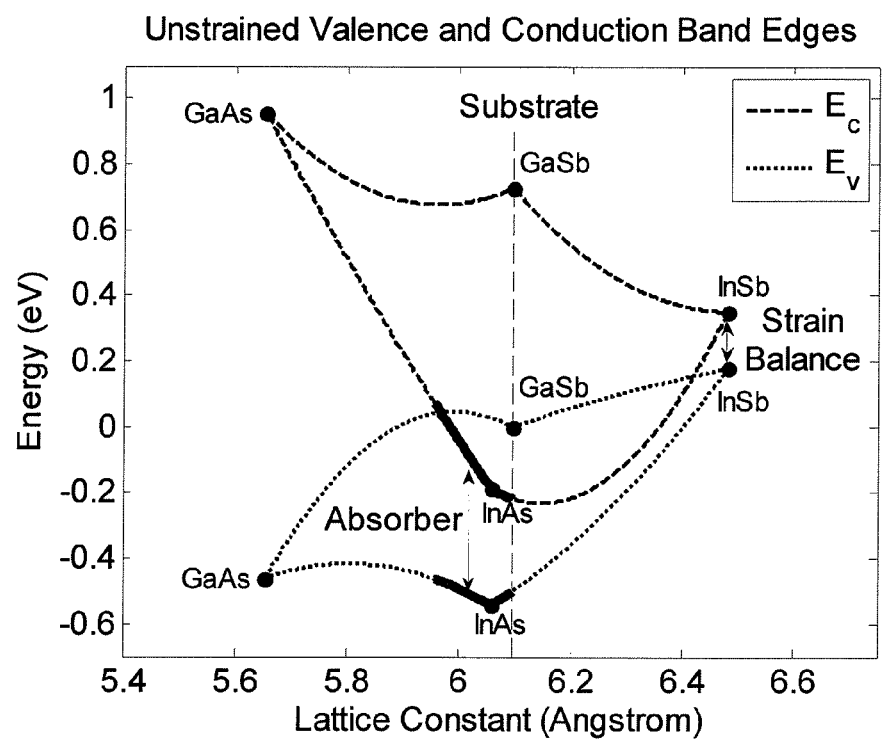
FIG. 17 shows the bandgap energies between the valence and conduction band edges for a GaSb substrate, InGaAs photo-absorbing layers, and InSb strain-compensating layers, according to an alternative embodiment of the present invention.

FIG. 17 shows the bandgap energies between the valence and conduction band edges of a material system corresponding to a further alternative embodiment of the present invention. In the embodiment of FIG. 17, the photo-absorbing region will exhibit a cutoff wavelength increasingly smaller than 4.2 μm as the antimony content of the InAs(1−x)Sb(x) absorber material is decreased from the lattice-matched value x≈0.09. Once the antimony content of the absorber material is zero, the addition of gallium into the InAs material will further lower the lattice constant below that of the GaSb substrate, resulting in a InGaAs absorber material that is tensile-strained. To balance this tensile-strained absorber, thin layers of InSb strain-compensating layers can be interspersed alternatingly with the InGaAs photo-absorbing layers in the same manner as described with respect to the embodiments of FIGS. 1A and 1B, with the exception that the strain components are reversed from that of FIG. 1. Owing to these features, a cutoff wavelength for a strain-balanced photo-absorbing region may be tailored to be a particular value less than that of 4.2 μm, while the photo-absorbing region is in a substantially lattice-mismatched condition with the substrate.

Figure 19:
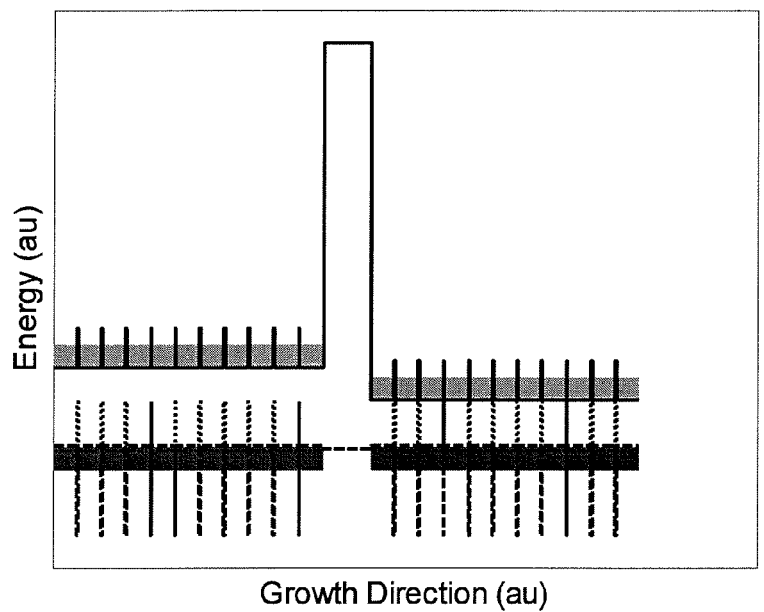
FIG. 19 shows an example of band edge alignment between the hole mini-bands and the barrier valence band edge of a strain-balanced two-color photodetector exhibiting two different cutoff wavelengths, according to an alternative embodiment of FIG. 18.

Based on the foregoing, and according to a further embodiment of the present invention, a photodetector may be constructed with two photo-absorbing regions on either side of the barrier layer, each potentially exhibiting a different cutoff wavelength. Thus, a photodetector constructed such as shown in FIG. 18 may be tailored to detect two specific and desired colors of infrared light while maintaining a strain-balanced construction with a reduced dark current. FIG. 19 shows an example of band edge alignment between the hole mini-bands and the barrier valence band edge of a strain-balanced two-color photodetector exhibiting two different long cutoff wavelengths, according to an alternative embodiment of FIG. 18.

FIG. 20 shows a photodetector with a strain-compensation graded bandgap adapted from a graded bandgap design as disclosed by Scott et al. in U.S. Pat. Pub. No. 2008/0111152 A1. In FIG. 20, the bandgap of the photo-absorbing layer 20 decreases as the distance from the barrier 16 decreases. The decrease in the bandgap of photo-absorbing layer 20 is achieved by increasing the Sb content x in the InAs(1−x)Sb (x) photo-absorbing layer 20 in the direction of the barrier. The chemical potential caused by the increasing Sb content creates a quasi-field that pushes the minority carriers into the barrier 16 for collection. This quasi-field has the beneficial quality of reducing the effect of lateral diffusion in the planar absorber that can result in crosstalk of photogenerated carriers between adjacent pixels.

Since the Sb content of the photo-absorbing layer 20 increases in the direction of the barrier 16, the lattice constant of the photo-absorbing material also increases in the direction of the barrier 16, creating a lattice-mismatched condition during growth of the photo-absorbing layer 20 on the substrate. In order to strain-balance the photo-absorbing layer 20 having a graded bandgap, strain-compensating layers 22 may be interspersed within the photo-absorbing layer 20 at a gradually increasing periodicity in the direction of the barrier layer 16. In an alternative embodiment of the present invention, strain-balancing of the photo-absorbing layer 20 may instead be achieved by interspersing increasingly thicker strain-compensating layers in the direction of the barrier layer 16. Alternatively, strain-balancing of the photo-absorbing layer 20 may be achieved by a combination of a decreasing periodicity and an increasing thickness for the strain-compensating layers.

Only exemplary embodiments of the present invention are shown and described in the present disclosure. It is to be understood that the present invention is capable of use in various other combinations and environments and is capable of changes or modifications with the scope of the inventive concept as expressed herein. Such variations are not to be regarded as departure from the spirit and scope of the invention, and all such modifications as would be obvious to one skilled in the art are intended to be included within the scope of the following claims:

What is claimed is:

1. A strain-balanced photodetector with an extended wavelength, comprising:
   a first layer grown on a semiconductor substrate;
   a barrier layer located above the first layer; and
   a second layer located above the barrier layer,
   wherein the first layer comprises
      a plurality of photo-absorbing layers; and
      a plurality of strain-compensating layers interspersed between the plurality of photo-absorbing layers,
   wherein the photo-absorbing layers are grown substantially lattice-mismatched to the substrate, and the strain-compensating layers are interspersed between the photo-absorbing layers so as to substantially compensate for a mechanical strain of the photo-absorbing layers caused by the lattice-mismatched condition; and
   wherein each of the plurality of strain-compensating layers has a thickness such that the strain-compensating layers are substantially quantum-mechanically transparent.

2. The photodetector of claim 1, wherein the photo-absorbing layers are stacked in an alternating arrangement with the strain-compensating layers, with one of the strain-compensating layers being located between each pair of the photo-absorbing layers.

3. The photodetector of claim 1, wherein the plurality of photo-absorbing layers are comprised of indium arsenide antimonide (InAsSb) or indium gallium arsenide (InGaAs); and the plurality of strain-compensating layers are comprised of gallium arsenide (GaAs) or indium antimonide (InSb).

4. The photodetector of claim 3, wherein the substrate is comprised of gallium antimonide (GaSb) or indium arsenide (InAs).

5. The photodetector of claim 1, wherein the first layer has an aggregate thickness sufficient to exhibit photo-absorption with reasonable quantum efficiency while exhibiting an extended long cutoff frequency beyond that of a photodetector with a first layer that is grown lattice-matched to a substrate.

6. The photodetector of claim 1, wherein a portion of the second layer is etched down to the barrier layer to define a lateral extent of the photodetector.

7. The photodetector of claim 1, wherein the second layer comprises individual sections which are delineated from each other in a direction across the photodetector, each section corresponding to an individual detector element,
   wherein said barrier layer extends past the individual sections of the second layer in the direction across the photodetector, and is monolithically provided for each of the individual detector elements, thereby passivating the photodetector during operation by blocking the flow of majority carriers to exposed surfaces of said barrier layer.

8. The photodetector of claim 1, wherein the second layer forms a mesa on the barrier layer such that the barrier layer laterally extends beyond the mesa thereby passivating the photodetector during operation by preventing majority carriers from flowing to exposed surfaces of said barrier layer.

9. The photodetector of claim 1, wherein the first and second layers have the same majority carrier type such that the photodetector has no substantial depletion layer.

10. The photodetector of claim 1, wherein the barrier layer has a semiconductor alloy composition $AlAs_xSb_{1-x}$ with x being selected to provide a valence band energy for the barrier layer which is substantially equal to the valence band energy of the plurality of photo-absorbing layers.

11. The photodetector of claim 1, wherein the barrier layer comprises aluminum gallium arsenide antimonide (AlGaAsSb).

12. The photodetector of claim 11, wherein the AlGaAsSb barrier layer has a semiconductor alloy composition $AlGa_{1-y}As_xSb_{1-x}$ with $0.5 \le y < 1.0$ and with $0 \le x \le 0.1$ being selected to provide a valence band energy for the barrier layer which is substantially equal to the valence band energy of the plurality of photo-absorbing layers.

13. The photodetector of claim 1, wherein the photo-absorbing layers comprise $InAs_xSb_{1-x}$ with $0 \le x \le 0.9$.

14. The photodetector of claim 13, wherein each photo-absorbing layer has a layer thickness of about 100 nanometers or less.

15. The photodetector of claim 13, wherein each strain-compensating layer has a layer thickness of 5 nanometers or less.

16. The photodetector of claim 1, wherein a long cutoff wavelength of the photodetector is in a range of 4.5 to 10 μm at a temperature of 200° K or less.

17. The photodetector of claim 1, wherein the plurality of photo-absorbing layers comprise 10 to 2000 photo-absorbing layers.

18. The photodetector of claim 1, wherein the first layer has a thickness in the range of 1 to 10 μm.

19. The photodetector of claim 1, wherein the lattice constant of the photo-absorbing layers is larger than the lattice constant of the substrate such that each photo-absorbing layer is compression-strained and each strain-compensating layer is tensile-strained.

20. The photodetector of claim 1, wherein the lattice constant of the photo-absorbing layers is smaller than the lattice constant of the substrate such that each photo-absorbing layer is tensile-strained and each strain-compensating layer is compression-strained.

21. The photodetector of claim 1, wherein the first and second layers exhibit substantially identical compositions.

22. The photodetector of claim 1, wherein the first and second layers are either both n-type or both p-type.

23. The photodetector of claim 1, wherein the barrier layer comprises a substantially undoped material.

24. The photodetector of claim 1, further comprising:
    a first electrode electrically connected to the first layer; and
    a second electrode electrically connected to the second layer.

25. The photodetector of claim 1, where the first layer comprises a plurality of compressively strained photo-absorbing layers of indium arsenide antimonide (InAsSb) grown alternatingly with a plurality of strain-compensating layers of gallium arsenide (GaAs).

26. The photodetector of claim 25, wherein the semiconductor substrate is comprised of gallium antimonide (GaSb).

27. The photodetector of claim 25, wherein each InAsSb photo-absorbing layer comprises $InAs_xSb_{1-x}$ with $0 \leq x \leq 0.9$.

28. The photodetector of claim 25, wherein each GaAs layer has a thickness which is less than or equal to one-fifth of the thickness of an adjacent InAsSb layer.

29. The photodetector of claim 25, wherein the first layer has a total thickness in the range of 1 to 10 μm.

30. The photodetector of claim 25, wherein a long cutoff wavelength for the detection of light is in the range of 4.5 to 10 μm at a temperature of 160° K or less.

31. The photodetector of claim 25, wherein the first layer comprises 10 to 2000 pairs of alternating layers of InAsSb and GaAs.

32. The photodetector of claim 25, wherein the barrier layer comprises aluminum arsenide antimonide (AlAsSb).

33. The photodetector of claim 25, further comprising:
    a first electrode electrically connected to the first layer; and
    a second electrode electrically connected to the second layer.

34. The photodetector of claim 1, wherein the first layer exhibits a first cutoff wavelength and the second layer exhibits a second cutoff wavelength, and the first cutoff wavelength is shorter than the second cutoff wavelength such that the photo-detector is configured for two-color operation.

35. The photodetector of claim 1, wherein the first layer comprises an alloy of indium arsenide antimonide (InAsSb) substantially lattice-matched to gallium antimonide (GaSb); and the second layer comprises a plurality of tensile-strained strain-compensating layers interspersed between a plurality of compressive-strained photo-absorbing layers comprised of indium gallium arsenide antimonide (InGaAsSb).

36. The photodetector of claim 35, wherein the strain-compensating layers are comprised of gallium arsenide (GaAs).

37. The photodetector of claim 1, wherein the first layer comprises a plurality of compressive-strained strain-compensating layers comprised of indium arsenide antimonide (InAsSb) of $InAs_wSb_{1-w}$ with $0 \leq w \leq 0.9$ interspersed between a plurality of tensile-strained photo-absorbing layers comprised of indium gallium arsenide antimonide (InGaAsSb) of $In_xGa_{1-x}As_ySb_{1-y}$ with $0 \leq x \leq 1.0$ and $0 \leq y \leq 1.0$; and the second layer comprises an alloy of indium arsenide antimonide (InAsSb) substantially lattice-matched to gallium antimonide (GaSb).

38. The photodetector of claim 37, wherein the strain-compensating layers are comprised of indium antimonide (InSb).

39. The photodetector of claim 1, wherein the first layer comprises a plurality of compressive-strained strain-compensating layers comprised of indium arsenide antimonide (InAsSb) of $InAs_wSb_{1-w}$ with $0 \leq w \leq 0.9$ interspersed between a plurality of tensile strained photo-absorbing layers comprised of indium gallium arsenide antimonide (InGaAsSb) of $In_xGa_{1-x}As_ySb_{1-y}$ with $0 \leq x \leq 1.0$ and $0 \leq y \leq 1.0$.

40. The photodetector of claim 39, where the strain-compensating layers of the first layer are comprised of indium antimonide (InSb); and the strain-compensating layers of the second layer are comprised of gallium arsenide (GaAs).

41. The photodetector of claim 1, wherein the first layer comprises a plurality of photo-absorbing layers comprised of indium arsenide antimonide (InAsSb) and a plurality of strain-compensating layers comprised of gallium arsenide (GaAs); and the second layer comprises a plurality of photo-absorbing layers comprised of indium gallium antimonide (InGaSb) and a plurality of strain-compensating layers comprised of indium antimonide (InSb).

42. The photodetector of claim 1, wherein the substrate comprises gallim antimonide (GaSb) or indium arsenide (InAs); and the barrier layer comprises aluminum arsenide antimonide (AlAsSb) or aluminum gallium arsenide antimonide (AlGaAsSb).

43. The photodetector of claim 1, wherein a minority carrier band edge of at least one of the first and second layers is graded vertically by varying the alloy composition in a direction toward the barrier layer, and wherein a plurality of varying strain-compensating layers are interspersed within said at least one of the first and second layers such that the lattice structure is substantially prevented from dislocating.

44. The photodetector of claim 43, wherein the interval between the strain-compensating layers is gradually varied in the direction toward the barrier layer in order to balance the varying strain within the at least one of the first and second layers.

45. The photodetector of claim 44, wherein the thickness of the strain-compensating layers is gradually varied in the direction toward the barrier layer in order to balance the varying strain within the at least one of the first and second layers.

46. The photodetector of claim 43, wherein the thickness of the strain-compensating layers is gradually varied in the direction toward the barrier layer in order to balance the varying strain within the at least one of the first and second layers.

47. The photodetector of claim 46, wherein the interval between the strain-compensating layers is gradually varied in the direction toward the barrier layer in order to balance the varying strain within the at least one of the first and second layers.

48. A focal plane array with an extended cutoff wavelength, comprising:
    a plurality of photodetectors according to claim 1, arranged in a two-dimensional matrix.

49. A strain-balanced photodetector with an extended wavelength, comprising:
    a first layer grown on a semiconductor substrate;
    a barrier layer located above the first layer; and
    a second layer located above the barrier layer,
    wherein the first layer comprises
        a plurality of photo-absorbing layers; and
        a plurality of strain-compensating layers interspersed between the plurality of photo-absorbing layers, wherein the photo-absorbing layers are grown substantially lattice-mismatched to the substrate, and the strain-compensating layers are interspersed between the photo-absorbing layers so as to substantially compensate for a mechanical strain of the photo-absorbing layers caused by the lattice-mismatched condition; and wherein the plurality of strain-compensating layers are interspersed between the plurality of photo-absorbing layers at a periodic interval such that the strain-compensating layers are substantially transparent to quantum waveforms.

50. A strain-balanced photodetector with an extended wavelength, comprising:
   a first layer grown on a semiconductor substrate, where the first layer exhibits a valence band energy and a conducting band energy during operation of the photodetector;
   a barrier layer located above the first layer, where the barrier layer has a band energy gap and associated conduction and valence band energies; and
   a second layer located above the barrier layer, where the second layer exhibits a valence band energy and a conducting band energy during operation of the photodetector,
   wherein the relationship between the first and second layer valence and conduction band energies and the barrier layer conduction and valence band energies facilitates minority carrier current flow while inhibiting majority carrier current flow between the first and second layers; and
   wherein the first layer includes
      a plurality of photo-absorbing layers; and
      a plurality of strain-compensating layers interspersed between the plurality of photo-absorbing layers, and
   wherein the photo-absorbing layers are grown substantially lattice-mismatched to the substrate, and the strain-compensating layers are interspersed between the photo-absorbing layers so as to substantially compensate for a mechanical strain of the photo-absorbing layers caused by the lattice-mismatched condition.

51. A strain-balanced photodetector with an extended wavelength, comprising:
   a first layer grown on a semiconductor substrate;
   a barrier layer located above the first layer; and
   a second layer located above the barrier layer,
   wherein the second layer comprises
      a plurality of photo-absorbing layers; and
      a plurality of strain-compensating layers interspersed between the plurality of photo-absorbing layers, wherein
   the photo-absorbing layers are grown substantially lattice-mismatched to the barrier layer, and the strain-compensating layers are interspersed between the photo-absorbing layers so as to substantially compensate for a mechanical strain of the photo-absorbing layers caused by the lattice-mismatched condition; and
   wherein each of the plurality of strain-compensating layers has a thickness such that the strain-compensating layers are substantially quantum-mechanically transparent.

52. The photodetector of claim 51, wherein the lattice constant of the photo-absorbing layers is larger than the barrier layer such that each photo-absorbing layer is compression-strained and each strain-compensating layer is tensile-strained.

53. The photodetector of claim 51, wherein the lattice constant of the photo-absorbing layers is smaller than the barrier layer such that each photo-absorbing layer is tensile-strained and each strain-compensating layer is compression-strained.

54. The photodetector of claim 51, wherein the photo-absorbing layers are stacked in an alternating arrangement with the strain-compensating layers, with one of the strain-compensating layers being located between each pair of the photo-absorbing layers.

55. The photodetector of claim 51, wherein the plurality of photo-absorbing layers are comprised of indium arsenide antimonide (InAsSb) or indium gallium arsenide (InGaAs); and the plurality of strain-compensating layers are comprised of gallium arsenide (GaAs) or indium antimonide (InSb).

56. The photodetector of claim 55, wherein the substrate is comprised of gallium antimonide (GaSb) or indium arsenide (InAs).

57. The photodetector of claim 51, wherein the first layer has an aggregate thickness sufficient to exhibit photo-absorption with reasonable quantum efficiency while exhibiting an extended long cutoff frequency beyond that of a photodetector with a first layer that is grown lattice-matched to a substrate.

58. The photodetector of claim 51, wherein a portion of the second layer is etched down to the barrier layer to define a lateral extent of the photodetector.

59. The photodetector of claim 51, wherein the second layer comprises individual sections which are separate from each other in a direction across the photodetector, each section corresponding to an individual detector element,
   wherein said barrier layer extends past the individual sections of the second layer in the direction across the photodetector, and is monolithically provided for each of the individual detector elements, thereby passivating the photodetector during operation by blocking the flow of majority carriers to exposed surfaces of said barrier layer.

60. The photodetector of claim 51, wherein the second layer forms a mesa on the barrier layer such that the barrier layer laterally extends beyond the mesa thereby passivating the photodetector during operation by preventing majority carriers from flowing to exposed surfaces of said barrier layer.

61. The photodetector of claim 51, wherein the first and second layers have the same majority carrier type such that the photodetector has no substantial depletion layer.

62. The photodetector of claim 51, wherein the barrier layer has a semiconductor alloy composition $AlAs_xSb_{1-x}$ with x being selected to provide a valence band energy for the barrier layer which is substantially equal to the valence band energy of the plurality of photo-absorbing layers.

63. The photodetector of claim 51, wherein the barrier layer comprises aluminum gallium arsenide antimonide (AlGaAsSb).

64. The photodetector of claim 51, wherein the first and second layers exhibit substantially identical compositions.

65. The photodetector of claim 51, wherein the first and second layers are either both n-type or both p-type.

66. The photodetector of claim 51, wherein the barrier layer comprises a substantially undoped material.

67. The photodetector of claim 51, further comprising:
   a first electrode electrically connected to the first layer; and
   a second electrode electrically connected to the second layer.

68. The photodetector of claim 51, wherein a minority carrier band edge of at least one of the first and second layers is graded vertically by varying the alloy composition in a direction toward the barrier layer, and wherein a plurality of varying strain-compensating layers are interspersed within said at least one of the first and second layers such that the lattice structure is substantially prevented from dislocating.

69. A strain-balanced photodetector with an extended wavelength, comprising:
 a first layer grown on a semiconductor substrate;
 a barrier layer located above the first layer; and
 a second layer located above the barrier layer,
 the second layer including
  a plurality of photo-absorbing layers; and
  a plurality of strain-compensating layers interspersed between the plurality of photo-absorbing layers, wherein
 the photo-absorbing layers are grown substantially lattice-mismatched to the barrier layer, and the strain-compensating layers are interspersed between the photo-absorbing layers so as to substantially compensate for a mechanical strain of the photo-absorbing layers caused by the lattice-mismatched condition; and
 wherein the plurality of strain-compensating layers are interspersed between the plurality of photo-absorbing layers at a periodic interval such that the strain-compensating layers are substantially transparent to quantum waveforms.

70. A strain-balanced photodetector with an extended wavelength, comprising:
 a first layer grown on a semiconductor substrate, where the first layer exhibits a valence band energy and a conducting band energy during operation of the photodetector;
 a barrier layer located above the first layer, where the barrier layer has a band energy gap and associated conduction and valence band energies; and
 a second layer located above the barrier layer, where the second layer exhibits a valence band energy and a conducting band energy during operation of the photodetector,
 wherein the relationship between the first and second layer valence and conduction band energies and the barrier layer conduction and valence band energies facilitates minority carrier current flow while inhibiting majority carrier current flow between the first and second layers; and
 where the second layer includes
  a plurality of photo-absorbing layers; and
  a plurality of strain-compensating layers interspersed between the plurality of photo-absorbing layers, wherein
 the photo-absorbing layers are grown substantially lattice-mismatched to the barrier layer, and the strain-compensating layers are interspersed between the photo-absorbing layers so as to substantially compensate for a mechanical strain of the photo-absorbing layers caused by the lattice-mismatched condition.

71. A strain-balanced photodetector with an extended wavelength, comprising:
 a first layer disposed on a semiconductor substrate;
 a barrier layer located above the first layer; and
 a second layer located above the barrier layer,
 wherein the first layer comprises
  a plurality of photo-absorbing layers; and
  a plurality of strain-compensating layers interspersed between the plurality of photo-absorbing layers,
 wherein the photo-absorbing layers are substantially lattice-mismatched to the substrate, and the strain-compensating layers are interspersed between the photo-absorbing layers so as to substantially compensate for a mechanical strain of the photo-absorbing layers caused by the lattice-mismatched condition; and
 wherein each of the plurality of strain-compensating layers has a thickness such that the strain-compensating layers are substantially quantum-mechanically transparent.

72. A strain-balanced photodetector with an extended wavelength, comprising:
 a first layer disposed on a semiconductor substrate, where the first layer exhibits a valence band energy and a conducting band energy during operation of the photodetector;
 a barrier layer located above the first layer, where the barrier layer has a band energy gap and associated conduction and valence band energies; and
 a second layer located above the barrier layer, where the second layer exhibits a valence band energy and a conducting band energy during operation of the photodetector,
 wherein the relationship between the first and second layer valence and conduction band energies and the barrier layer conduction and valence band energies facilitates minority carrier current flow while inhibiting majority carrier current flow between the first and second layers; and
 wherein the first layer includes
  a plurality of photo-absorbing layers; and
  a plurality of strain-compensating layers interspersed between the plurality of photo-absorbing layers, and
 wherein the photo-absorbing layers are substantially lattice-mismatched to the substrate, and the strain-compensating layers are interspersed between the photo-absorbing layers so as to substantially compensate for a mechanical strain of the photo-absorbing layers caused by the lattice-mismatched condition.

\* \* \* \* \*